(12) United States Patent
Ito et al.

(10) Patent No.: US 12,021,106 B2
(45) Date of Patent: Jun. 25, 2024

(54) SOLID-STATE IMAGE SENSOR AND ELECTRONIC DEVICE

(71) Applicant: SONY SEMICONDUCTOR SOLUTIONS CORPORATION, Kanagawa (JP)

(72) Inventors: Tomomi Ito, Kanagawa (JP); Atsushi Masagaki, Kanagawa (JP); Yoshiharu Kudoh, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 8 days.

(21) Appl. No.: 17/781,661

(22) PCT Filed: Nov. 27, 2020

(86) PCT No.: PCT/JP2020/044394
§ 371 (c)(1),
(2) Date: Jun. 1, 2022

(87) PCT Pub. No.: WO2021/117523
PCT Pub. Date: Jun. 17, 2021

(65) Prior Publication Data
US 2023/0005981 A1  Jan. 5, 2023

(30) Foreign Application Priority Data

Dec. 9, 2019 (JP) .................................. 2019-222488

(51) Int. Cl.
*H01L 27/146* (2006.01)
(52) U.S. Cl.
CPC .. *H01L 27/14643* (2013.01); *H01L 27/14603* (2013.01); *H01L 27/14612* (2013.01); *H01L 27/1463* (2013.01); *H01L 27/14636* (2013.01)

(58) Field of Classification Search
CPC ............. H01L 21/76224; H01L 21/765; H01L 27/14603; H01L 27/14612;
(Continued)

(56) References Cited

U.S. PATENT DOCUMENTS

2008/0135898 A1    6/2008  Miura
2015/0372036 A1*  12/2015  Suh ..................... H01L 27/1464
                                                       257/432
(Continued)

FOREIGN PATENT DOCUMENTS

CN       104103655 A     10/2014
JP       2008-124344      5/2008
(Continued)

OTHER PUBLICATIONS

International Search Report and Written Opinion prepared by the Japan Patent Office dated Feb. 19, 2021, for International Application No. PCT/JP2020/044394, 2 pgs.

*Primary Examiner* — Amy R Hsu
(74) *Attorney, Agent, or Firm* — Sheridan Ross PC

(57) ABSTRACT

Provided is a solid-state image sensor and an electronic device capable of suppressing the occurrence of a strong electrical field near a transistor while being compact. The solid-state image sensor includes a photoelectric conversion element that performs photoelectric conversion, an element isolation that penetrates from a first main surface to a second main surface of a substrate and that is formed between pixels including the photoelectric conversion element, and a conductive part provided in close contact with a first main surface side of the element isolation.

13 Claims, 21 Drawing Sheets

(58) Field of Classification Search
CPC ........... H01L 27/14614; H01L 27/1463; H01L 27/14636; H01L 27/1464; H01L 27/14643; H01L 27/14689
See application file for complete search history.

(56) References Cited

U.S. PATENT DOCUMENTS

| | | | |
|---|---|---|---|
| 2016/0043130 A1* | 2/2016 | Ohguro | H01L 27/14638 257/225 |
| 2016/0284757 A1 | 9/2016 | Kaneda | |
| 2017/0373108 A1 | 12/2017 | Hwangbo | |
| 2019/0157323 A1 | 5/2019 | Ogi | |
| 2020/0176500 A1* | 6/2020 | Sze | H01L 27/14614 |
| 2022/0085088 A1* | 3/2022 | Toda | G02B 5/204 |

FOREIGN PATENT DOCUMENTS

| | | |
|---|---|---|
| JP | 2012-099841 | 5/2012 |
| JP | 2016-039315 | 3/2016 |
| JP | 2016-184624 | 10/2016 |

\* cited by examiner

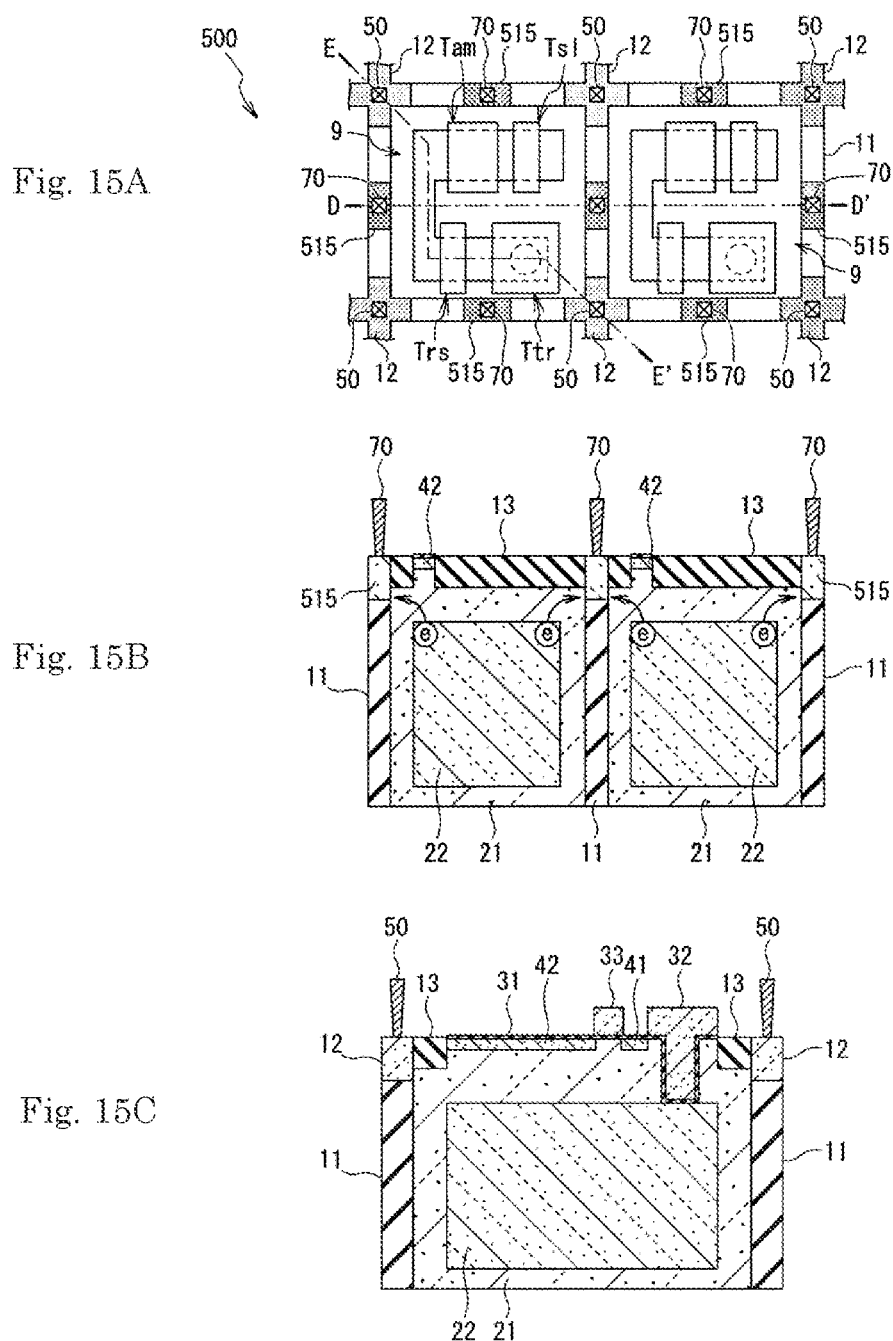

SOLID-STATE IMAGE SENSOR AND ELECTRONIC DEVICE

CROSS REFERENCE TO RELATED APPLICATIONS

This application is a national stage application under 35 U.S.C. 371 and claims the benefit of PCT Application No. PCT/JP2020/044394, having an international filing date of 27 Nov. 2020, which designated the United States, which PCT application claimed the benefit of Japanese Patent Application No. 2019-222488, filed 9 Dec. 2019, the entire disclosures of each of which are incorporated herein by reference.

TECHNICAL FIELD

The present disclosure relates to a solid-state image sensor and an electronic device.

BACKGROUND ART

Solid-state image sensors having Front Full Trench Isolation (FFTI) are being used in recent years. In a solid-state image sensor having FFTI, pixels are separated by insulators, and the pixels are therefore electrically isolated from each other. It is therefore necessary for the individual isolated pixels to include contact electrodes for setting a semiconductor substrate to a ground potential, for example. To reduce the surface area of the contact electrodes when viewed in plan view, a solid-state image sensor has been proposed in which the contact electrodes are formed with part of the FFTI being used as an active region (e.g., PTL 1).

CITATION LIST

Patent Literature

[PTL 1]
JP 2016-39315 A

SUMMARY

Technical Problem

In such a solid-state image sensor, an impurity region serving as a source/drain of a transistor, which is a region having a high impurity concentration, and the contact electrodes are in close contact or in proximity with each other, in order to reduce the size of the sensor. As a result, a strong electrical field forms between the impurity region and the contact electrodes.

Accordingly, an object of the present disclosure is to provide a solid-state image sensor and an electronic device capable of suppressing the occurrence of a strong electrical field near a transistor while being compact.

Solution to Problem

To solve the above-described problem, a solid-state image sensor according to one aspect of the present disclosure includes a photoelectric conversion element that performs photoelectric conversion, a front full trench isolation that penetrates from a first main surface to a second main surface of a substrate and that is formed between pixels including the photoelectric conversion element, and a conductive part provided in close contact with a first main surface side of the front full trench isolation.

Additionally, an electronic device according to another aspect of the present disclosure includes: a solid-state imaging device including a solid-state image sensor having a photoelectric conversion element that performs photoelectric conversion, a front full trench isolation that penetrates from a first main surface to a second main surface of a substrate and that is formed between pixels including the photoelectric conversion element, and a first conductive part provided in close contact with a first main surface side of the front full trench isolation; an optical lens that forms an image of image light from a subject on an image capturing surface of the solid-state imaging device; and a signal processing circuit that performs signal processing on a signal output from the solid-state imaging device.

BRIEF DESCRIPTION OF DRAWINGS

FIG. 15A is a plan view illustrating an example of the layout of a solid-state image sensor according to a fifth embodiment of the present disclosure.

FIG. 15B is a cross-sectional view illustrating an example of the configuration of the solid-state image sensor according to the fifth embodiment of the present disclosure.

FIG. 15C is a cross-sectional view illustrating an example of the configuration of the solid-state image sensor according to the fifth embodiment of the present disclosure.

DESCRIPTION OF EMBODIMENTS

Examples of an optical element, an optical element array, an electronic device, and a method of manufacturing an optical element according to embodiments of the present disclosure will be described hereinafter with reference to FIGS. 1 to 18. The embodiments of the present disclosure will be described in the following order. Note that the present disclosure is not limited to the following examples. In addition, the effects described in the present specification are merely illustrative and not limiting, and other effects may be obtained.

Figure 1:
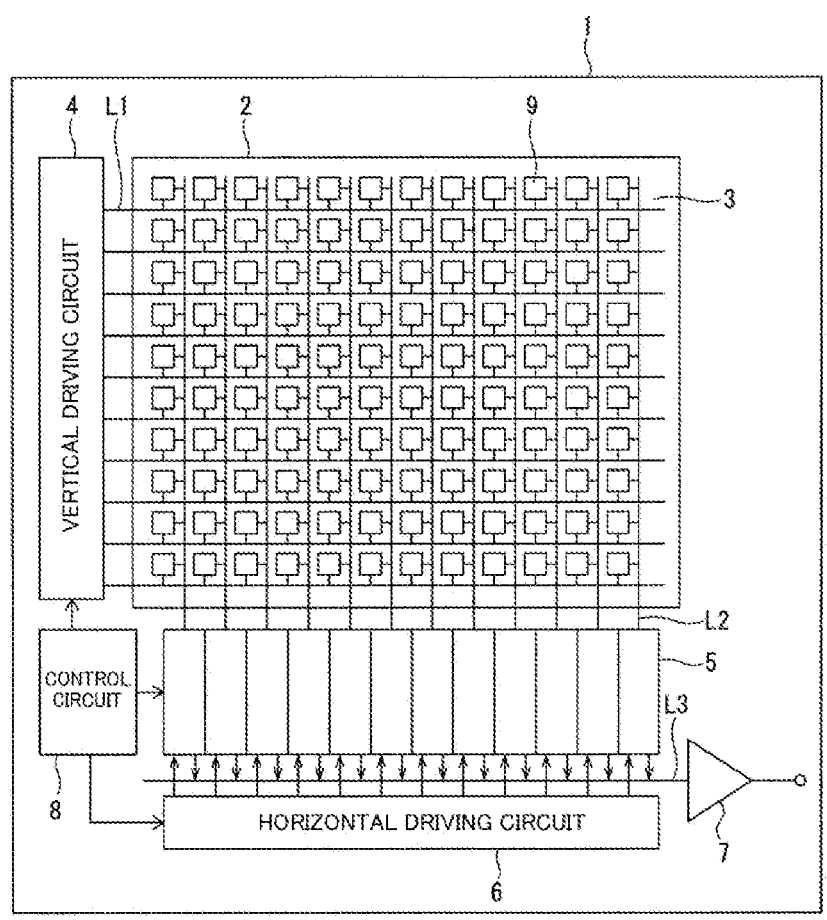
FIG. 1 is a diagram illustrating the overall configuration of a solid-state imaging device according to a first embodiment of the present disclosure.

1. First Embodiment: Solid-State Imaging Device
  (1.1) Overall Configuration of Solid-State Imaging Device
  (1.2) Configuration of Solid-State Image Sensor
  (1.3) Method of Manufacturing Solid-State Image Sensor
  (1.4) Variations
2. Second Embodiment: Solid-State Image Sensor
  (2.1) First Example of Solid-State Image Sensor 200
  (2.2) Second Example of Solid-State Image Sensor 200
  (2.3) Third Example of Solid-State Image Sensor 200
3. Third Embodiment: Solid-State Image Sensor
  (3.1) Configuration of Solid-State Image Sensor
4. Fourth Embodiment: Solid-State Image Sensor
  (4.1) Configuration of Solid-State Image Sensor
5. Fifth Embodiment: Solid-State Image Sensor
  (5.1) Configuration of Solid-State Image Sensor
6. Sixth Embodiment: Solid-State Image Sensor
  (6.1) Configuration of Solid-State Image Sensor
    (6.1.1) First Example of Solid-State Image Sensor 600
    (6.1.2) Second Example of Solid-State Image Sensor 600
7. Seventh Embodiment: Electronic Device 1. First Embodiment: Solid-State Imaging Device (1.1) Overall Configuration of Solid-State Imaging Device A solid-state imaging device 1 according to a first embodiment of the present disclosure will be described. FIG. 1 is a schematic diagram illustrating the solid-state imaging device 1 according to the first embodiment of the present disclosure as a whole.

Figure 18:
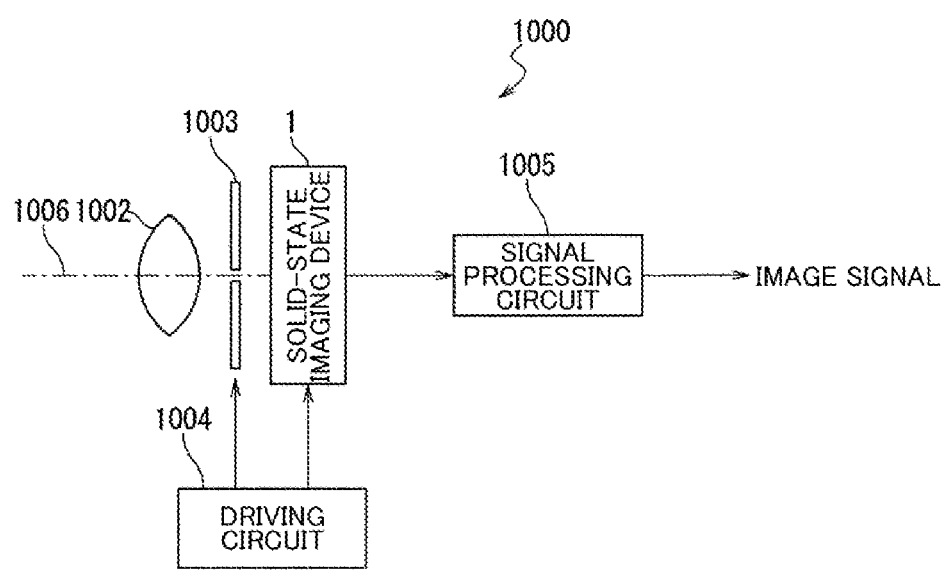
FIG. 18 is a schematic diagram of an electronic device according to a seventh embodiment of the present disclosure.

The solid-state imaging device 1 illustrated in FIG. 1 is a backside-illumination type complementary metal oxide semiconductor (CMOS) image sensor. As illustrated in FIG. 18, the solid-state imaging device 1 takes in image light (incident light 1006) from a subject through an optical lens 1002, converts the amount of incident light 1006 formed as an image on an image capturing surface into an electrical signal in units of pixels in a signal processing circuit 1005, and outputs the electrical signal as an image signal (a pixel signal).

As illustrated in FIG. 1, the solid-state imaging device 1 according to the first embodiment includes a substrate 2, a pixel region 3, a vertical driving circuit 4, column signal processing circuits 5, a horizontal driving circuit 6, an output circuit 7, and a control circuit 8.

The pixel region 3 includes a plurality of pixels 9 arranged regularly in a two-dimensional array on the substrate 2. Each pixel 9 includes a photoelectric conversion unit 23, illustrated in FIG. 2B, and a plurality of pixel transistors (not shown). As the plurality of pixel transistors, for example, four transistors, that is, a transfer transistor, a reset transistor, a selecting transistor, and an amplifier transistor can be employed. In addition, for example, the three transistors except for the selecting transistor may be employed.

The vertical driving circuit 4, which is constituted by, for example, a shift register, selects a desired pixel driving wire L1, supplies a pulse for driving the pixels 9 to the selected pixel driving wire L1, and drives the pixels 9 in units of rows. That is, the vertical driving circuit 4 sequentially performs selection scanning on the pixels 9 in the pixel region 3 in the vertical direction in units of rows, and supplies a pixel signal based on signal charges generated in accordance with the amount of light received in the photoelectric conversion unit 23 of each of the pixels 9 to the column signal processing circuits 5 through vertical signal lines L2.

The column signal processing circuit 5 is disposed, for example, for each column of the pixel 9, and performs signal processing such as noise removal for each pixel column on a signal which is output from the pixels 9 corresponding to one row. For example, the column signal processing circuit 5 performs signal processing such as correlated double sampling (CDS) and analog digital (AD) conversion for removing pixel-specific fixed pattern noise.

The horizontal driving circuit 6, which is constituted by, for example, a shift register, sequentially outputs a horizontal scanning pulse to the column signal processing circuits 5 to select each of the column signal processing circuits 5 in order, and outputs a pixel signal having been subjected to signal processing to a horizontal signal line L3 from each of the column signal processing circuits 5.

The output circuit 7 performs signal processing on pixel signals sequentially supplied and outputs the pixel signals through the horizontal signal line L3 from each of the column signal processing circuits 5. Examples of the signal processing which may be used include buffering, black level adjustment, column variation correction, various types of digital signal processing, and the like, for example.

The control circuit 8 generates a clock signal or a control signal as a reference for operations of the vertical driving circuit 4, the column signal processing circuit 5, the horizontal driving circuit 6, and the like on the basis of a vertical synchronization signal, a horizontal synchronization signal, and a master clock signal. In addition, the control circuit 8 outputs the generated clock signal or control signal to the vertical driving circuit 4, the column signal processing circuit 5, the horizontal driving circuit 6, and the like.

(1.2) Configuration of Solid-State Image Sensor

Figure 2A:
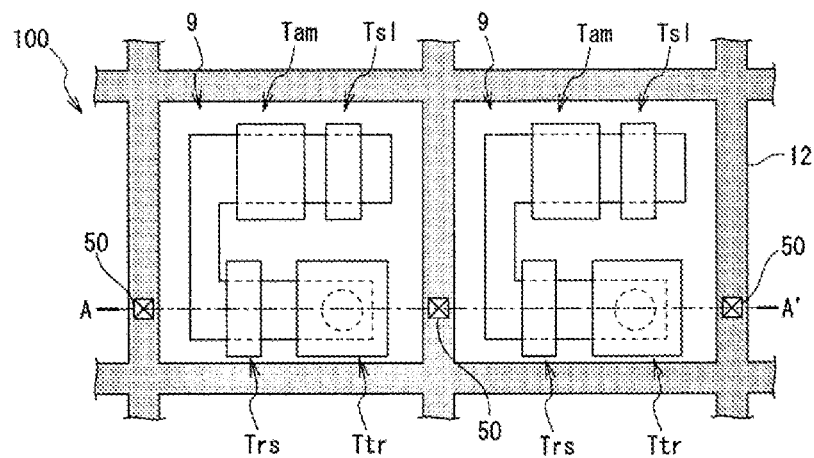
FIG. 2A is a plan view illustrating an example of the layout of a solid-state image sensor according to the first embodiment of the present disclosure.
Figure 2B:
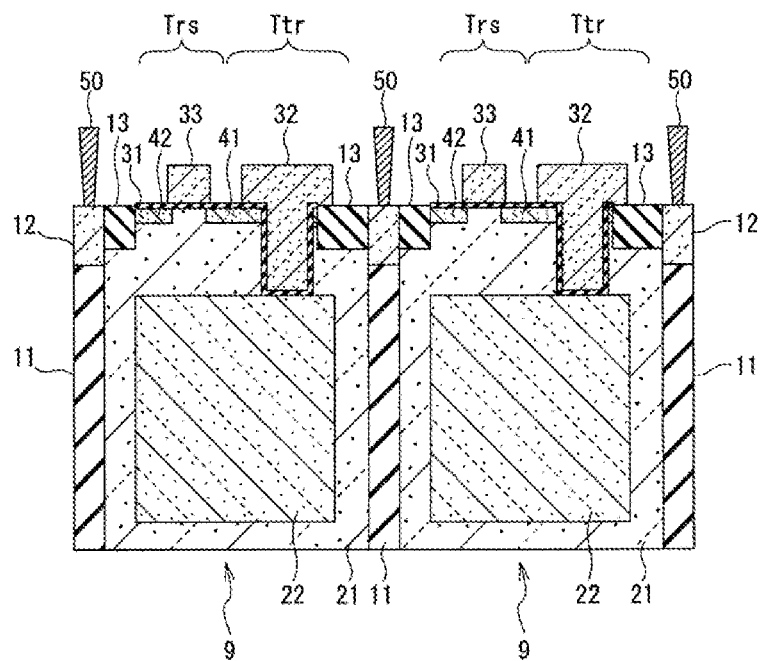
FIG. 2B is a cross-sectional view illustrating an example of the configuration of the solid-state image sensor according to the first embodiment of the present disclosure.

Next, the structure of the solid-state imaging device 1 in FIG. 1 will be described in detail with reference to FIGS. 2A and 2B. FIG. 2A is a plan view illustrating an example of the layout of a solid-state image sensor 100 in the pixel region 3 of the solid-state imaging device 1. FIG. 2B is a cross-sectional view of the pixel 9 in the solid-state image sensor 100, at an A-A cross-section indicated in FIG. 2A. The solid-state imaging device 1 including the solid-state image sensor 100 illustrated in FIGS. 2A and 2B is a backside-illumination type CMOS image sensor (CMOS solid-state imaging device).

As illustrated in FIG. 2A, in the solid-state image sensor 100, a plurality of pixels 9 (9a, 9b, and the like) are arranged two-dimensionally on the substrate 2. The solid-state image sensor 100 includes a transfer transistor Ttr, a reset transistor Trs, an amplifying transistor Tam, and a select transistor Tsl.

The transfer transistor Ttr is a transistor that reads out a charge from a photoelectric conversion element 22 and transfers the charge to a floating diffusion 41. The reset transistor Trs is a transistor that resets the potential of the floating diffusion 41 to a supply voltage. The amplifying transistor Tam is a transistor that takes the potential of the floating diffusion 41 at a gate and outputs that potential to a vertical signal line (VSL) with a source follower. The select transistor Tsl is a transistor that connects the amplifying transistor Tam of the line to be read out to the vertical signal line, and disconnects the amplifying transistor Tam of a line not to be read from the vertical signal line.

As illustrated in FIGS. 2A and 2B, the solid-state image sensor 100 has a structure in which pixels 9 (9a, 9b, and the like), each including a photoelectric conversion element (photodiode; PD) 22 that photoelectrically converts incident light, are isolated by Front Full Trench Isolation (FFTI) 11. In the solid-state image sensor 100, light enters the photoelectric conversion element 22 from a second main surface (the lower surface in FIG. 2B) side, which is opposite from a first main surface (the upper surface in FIG. 2B), which is a transistor formation surface of the solid-state image sensor 100. Hereinafter, the first main surface may be referred to as a "top surface" and the second main surface as a "bottom surface".

As illustrated in FIG. 2B, the solid-state image sensor 100 includes the substrate 2, the FFTI 11, an embedded conductor part 12, an insulating part 13, a well layer 21, and the photoelectric conversion element 22. The solid-state image sensor 100 also includes a gate insulating film 31, gate electrodes 32, 33, 34, and 35, as well as the floating diffusion 41 and a high-concentration impurity diffusion layer 42. Note that FIGS. 2A and 2B also illustrate a GND contact 50, which is electrically connected to the embedded conductor part 12. On the bottom surface side of the substrate 2, a light collecting layer is formed in which a color filter layer and a wafer lens (not shown) are stacked in that order. Furthermore, a wiring layer and a logic board (not shown) are stacked in that order on the transistor formation side surface (the top surface) of the substrate 2.

Substrate

The substrate 2 is formed from silicon (Si), for example. The pixel region 3, in which the plurality of pixels 9 are arranged, is formed on the substrate 2. As illustrated in FIG. 2B, in the pixel region 3, the plurality of pixels 9, each including the photoelectric conversion element 22, are formed on the substrate 2 and arranged in a two-dimensional matrix.

Front Full Trench Isolation

The front full trench isolation (FFTI) 11 penetrates from the transistor formation side surface (the top surface) to the bottom surface of the substrate 2, and is formed so as to completely isolate each pixel 9. The FFTI 11 is provided around the pixel 9 in a plan view, and each pixel 9 is electrically isolated separated from the adjacent pixels 9 by the FFTI 11. The FFTI 11 has a structure in which an element isolation film such as silicon oxide film, silicon nitride film, or the like is embedded in a trench formed in the substrate 2. Additionally, the FFTI 11 may have a two-layer structure constituted by an element isolation film formed to cover an inner wall of the trench and a semiconductor film such as silicon embedded in the trench where the element isolation film is formed.

Embedded Conductor Part

The embedded conductor part 12 functions as a contact electrode for GND contact to the substrate 2 (the high-concentration impurity diffusion layer 42). The embedded conductor part 12 can be embedded in the trench formed in the top surface of the substrate 2. The embedded conductor part 12 is formed by embedding the entirety of the trench provided in an upper part of the substrate 2, which takes the FFTI 11 as the bottom surface, with a conductive film.

As described above, in the solid-state image sensor 100, each pixel 9 is electrically isolated by the FFTI 11. For this reason, in the solid-state image sensor 100, it is necessary for the isolated individual pixels 9 to have potential (reference potential) contact with the well layer 21. In the solid-state image sensor 100, a part of the transistor formation surface side of the FFTI 11 is used as the embedded conductor part 12, which serves as an active region and functions as a contact electrode. By placing the embedded conductor part 12 closely above the FFTI 11, an increase in the surface area of the solid-state image sensor 100 in plan view due to the formation of contact electrodes can be suppressed, and the surface area of the solid-state image sensor 100 can be made smaller.

In the present embodiment, the embedded conductor part 12 is provided at all of the boundaries between the pixels 9, as illustrated in FIG. 2A. The GND contact 50 is provided to connect with a part of the embedded conductor part 12 at the boundary between the pixels 9.

The embedded conductor part 12 is formed above the FFTI 11 (on the transistor formation surface side) in a cross-sectional view. The embedded conductor part 12 is formed deeper than the insulating part 13, and is accordingly disposed close to the well layer 21 in a region deeper than the insulating part 13. As a result, the embedded conductor part 12 is electrically connected to the well layer 21 through ohmic bonding.

As illustrated in FIGS. 2A and 2B, the embedded conductor part 12 is provided close above the FFTI 11 between pixels 9 and is shared as a contact electrode for GND contact between two adjacent pixels 9.

The embedded conductor part 12 is formed from a conductive film. It is preferable to use silicon or another semiconductor material doped with P-type or N-type impurities, or a metal, as the conductive film. For example, polycrystal silicon, amorphous silicon, epitaxially-grown silicon, or the like is preferable as the silicon.

Insulating Part

The insulating part 13 is an insulating layer that is provided between the embedded conductor part 12 and the high-concentration impurity diffusion layer 42 on the top surface of the substrate 2 (the transistor formation side surface). By providing the insulating part 13 between the embedded conductor part 12 and the high-concentration impurity diffusion layer 42, a situation where the embedded conductor part 12 and the high-concentration impurity diffusion layer 42 are in close contact with each other and a strong electrical field arises between the embedded conductor part 12 and the high-concentration impurity diffusion layer 42 is suppressed.

The insulating part 13 is formed by Shallow Trench Isolation (STI) or an insulating film. For STI, any commonly used material can be used, such as silicon oxide, for example. As the insulating film, it is preferable to use an oxide film, and particularly preferable to use a silicon oxide film. The insulating part 13 is formed by embedding an oxide film, for example, as an insulating film in a trench formed on the top surface (the transistor formation side surface) of the substrate 2.

By providing such an insulating part 13, the embedded conductor part 12 and the high-concentration impurity diffusion layer 42 (described later) are not in close contact with each other, and the distance between the embedded conductor part 12 and the high-concentration impurity diffusion layer 42 is greater as a result. This makes it difficult for a strong electrical field to arise between the embedded conductor part 12 and the high-concentration impurity diffusion layer 42, and improves the stability of the output of the solid-state image sensor 100. Additionally, by providing such an insulating part 13, the embedded conductor part 12 and the high-concentration impurity diffusion layer 42 are separated with respect to the vertical direction (the depth direction of the substrate 2). Therefore, the occurrence of a strong electrical field between the embedded conductor part 12 and the high-concentration impurity diffusion layer 42 can be suppressed without increasing the size of the solid-state image sensor 100 in plan view, making it possible to both reduce the surface area of the solid-state image sensor 100 and improve the stability of the output. The deeper the insulating part 13 and the embedded conductor part 12 are formed, the greater the distance, in the vertical direction, between the embedded conductor part 12 and the high-concentration impurity diffusion layer 42 becomes. Therefore, it is possible to suppress the occurrence of a strong electrical field by forming the insulating part 13 and the embedded conductor part 12 at a depth that corresponds to the magnitude of current flowing in the solid-state image sensor 100, for example.

Well Layer

The well layer 21 is a P-type region in which impurities of P-type (an example of a first conductivity type) are diffused at a low concentration. The well layer 21 is formed in a region deeper than the high-concentration impurity diffusion layer 42, which will be described later. The well layer 21 is disposed in close contact with the conductor part 12 in a region deeper than the insulating part 13. The well layer 21 forms a PN junction with the photoelectric conversion element 22, as will be described later.

Photoelectric Conversion Element

The photoelectric conversion element 22 is a photodiode that converts incident light into an amount of electric charge corresponding to a received light amount and stores the charge. The photoelectric conversion element 22 receives light corresponding to the color of a color filter, the light being incident through a lens and the color filter that are provided for the photoelectric conversion element 22 on the bottom surface of the substrate. The photoelectric conversion elements 22 provided in each of the pixels 9 are separated by the FFTI 11.

The photoelectric conversion element 22 is a region formed in each pixel 9 in a region surrounded by the well layer 21, which is a P-type region. The photoelectric conversion element 22 is an N-type region in which impurities of N-type (an example of a second conductivity type), which are different from the impurities diffused in the well layer 21, are diffused at a low concentration. As a result, a PN junction is formed between the photoelectric conversion element 22 and the well layer 21, and the photoelectric conversion element 22 therefore has a photoelectric conversion function.

The photoelectric conversion element 22 functions as a source region of the transfer transistor Ttr.

Gate Insulating Film

The gate insulating film 31 is an insulating film formed between the photoelectric conversion element 22 and the floating diffusion 41, and between the floating diffusion 41 and the high-concentration impurity diffusion layer 42. The gate insulating film 31 is a silicon oxide film, for example.

Gate Electrodes

The gate electrodes 32, 33, 34 and 35 are the gate electrodes of the transfer transistor Ttr, the reset transistor Trs, the amplifying transistor Tam, and the select transistor Tsl, respectively.

As illustrated in FIG. 2B, the gate electrodes 32, 33, 34, and 35 are formed from conductive films such as polycrystal silicon films. In particular, the gate electrode 32 is formed in a trench formed so as to extend to the vicinity of the photoelectric conversion element 22 with respect to the well layer 21. The gate electrode 32 is formed by embedding a conductive film in a trench with the gate insulating film 31 provided on the surface.

Floating Diffusion

The floating diffusion 41 is formed on the transistor formation side (upper side) surface of the substrate 2, and is a region that temporarily holds a charge read out by the transfer transistor Ttr. The floating diffusion 41 is a region where impurities of the N-type (an example of the second conductivity type) are diffused at a high concentration, for example, in the transistor formation region on the top surface of the substrate 2. The floating diffusion 41 is formed in a region of the well layer 21 that includes the boundary between a channel region of the transfer transistor Ttr and a channel region of the reset transistor Trs.

The floating diffusion 41 functions as a drain region when driving the transfer transistor Ttr, and as a source region when driving the reset transistor Trs.

High-Concentration Impurity Diffusion Layer

The high-concentration impurity diffusion layer 42 is formed on the transistor formation surface (top surface) side of the substrate 2, and is a region where impurities of, for example, the N-type (an example of the second conductivity type) are diffused at a high concentration. The high-concentration impurity diffusion layer 42 is formed shallower than the insulating part 13. The high-concentration impurity diffusion layer 42 functions as the drain region of the reset transistor Trs.

With the solid-state image sensor 100 according to the first embodiment as described thus far, the occurrence of a strong electrical field between the embedded conductor part 12 and the high-concentration impurity diffusion layer 42 can be suppressed without increasing the size of the solid-state image sensor 100 in plan view, making it possible to both reduce the surface area of the solid-state image sensor 100 and improve the stability of the output.

(1.3) Method of Manufacturing Solid-State Image Sensor

A method of manufacturing the solid-state image sensor 100 according to the first embodiment will be described with reference to FIGS. 3A to 3G. FIGS. 3A to 3G are process cross-sectional views illustrating the method of manufacturing the solid-state image sensor 100. FIGS. 3A to 3G illustrate process cross-sectional views of the pixel 9 (a unit pixel).

Figure 3A:
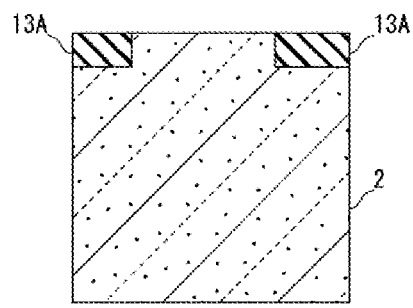
FIG. 3A is a process cross-sectional view illustrating an example of a method of manufacturing the solid-state image sensor according to the first embodiment of the present disclosure.

As illustrated in FIG. 3A, a STI 13A is formed by forming a trench in the first main surface, which is the transistor formation surface of the substrate 2 (the top surface in FIG. 3A), and embedding an insulating material therein.

Figure 3B:
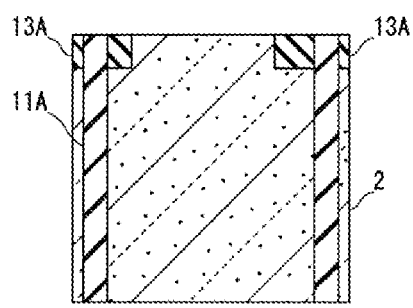
FIG. 3B is a process cross-sectional view illustrating an example of the method of manufacturing the solid-state image sensor according to the first embodiment of the present disclosure.

Then, as illustrated in FIG. 3B, a trench that penetrates from the first main surface of the substrate 2 to the second main surface, which is on the opposite side of the substrate 2 (the bottom surface in FIG. 3B), is formed, after which an element isolation film 11' such as silicon oxide film, silicon nitride film, or the like is embedded therein. At this time, the trench is formed so as to penetrate the STI.

Figure 3C:
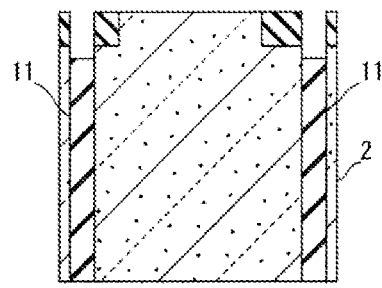
FIG. 3C is a process cross-sectional view illustrating an example of the method of manufacturing the solid-state image sensor according to the first embodiment of the present disclosure.
Figure 3D:
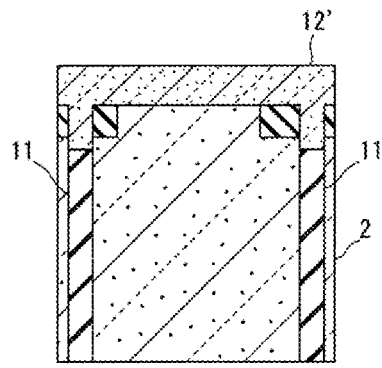
FIG. 3D is a process cross-sectional view illustrating an example of the method of manufacturing the solid-state image sensor according to the first embodiment of the present disclosure.

Then, as illustrated in FIG. 3C, a part of the first main surface of the element isolation film 11' embedded in the trench is removed to form a trench. As a result, the FFTI 11 is formed by the element isolation film 11'. Note that before removing the part of the first main surface of the element isolation film 11', an etching stopper film may be formed on the first main surface of the substrate 2. As illustrated in FIG. 3D, a semiconductor film 12', such as, for example, polysilicon doped with impurities, is formed so as to cover the trench which has been formed and the first main surface of the substrate 2. The semiconductor film 12' is formed, for example, by chemical vapor deposition (CVD) or the like.

Figure 3E:
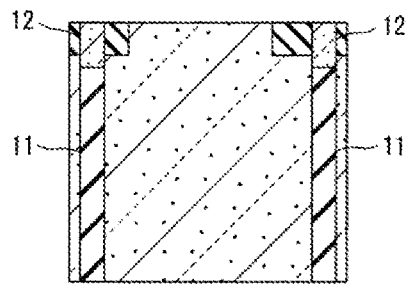
FIG. 3E is a process cross-sectional view illustrating an example of the method of manufacturing the solid-state image sensor according to the first embodiment of the present disclosure.

As illustrated in FIG. 3E, the semiconductor film 12' deposited on the first main surface of the substrate 2 is planarized through chemical mechanical polishing (CMP). The embedded conductor part 12 is formed as a result.

Figure 3F:
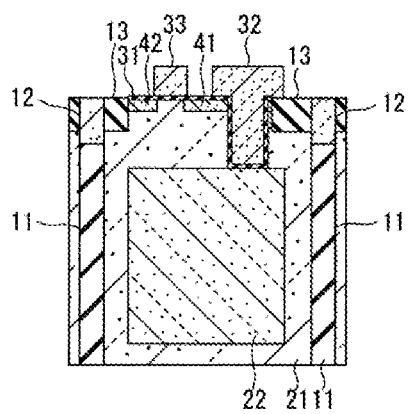
FIG. 3F is a process cross-sectional view illustrating an example of the method of manufacturing the solid-state image sensor according to the first embodiment of the present disclosure.

As illustrated in FIG. 3F, semiconductor elements are formed in the pixels 9 separated by the FFTI 11. First, the well layer 21, which is a P-type region, is formed by ion-implanting P-type impurities into the substrate 2. The photoelectric conversion element 22, which is an N-type region, is formed by ion-implanting N-type impurities into the region surrounded by the well layer 21. A PN junction is formed between the well layer 21 and the photoelectric conversion element 22. Next, by thermally oxidizing the substrate 2, a trench is formed extending from the top surface of the substrate 2 to the vicinity of the top surface of the photoelectric conversion element 22. After this, the gate insulating film 31 is formed covering the top surface of the substrate 2 and the surface of the trench. Then, a conductive film is embedded in the trench where the gate insulating film 31 is provided, and a conductive film is formed on the top surface of the substrate 2. After this, a part of the conductive film is removed using a lithography technique and an etching technique, and the gate electrode 32 of the transfer transistor Ttr and the gate electrode 33 of the reset transistor Trs are formed as a result. Finally, N-type impurities are ion-implanted into a predetermined region on the top surface of the substrate 2, and the ion-implanted region is then activated through thermal treatment. The floating diffusion 41 and the high-concentration impurity diffusion layer 42 are formed as a result.

Figure 3G:
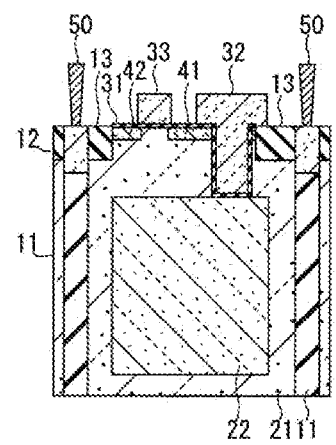
FIG. 3G is a process cross-sectional view illustrating an example of the method of manufacturing the solid-state image sensor according to the first embodiment of the present disclosure.

As illustrated in FIG. 3G, after an interlayer insulating film is formed to cover the top surface of the substrate 2 where each transistor is formed, a contact hole which penetrates the interlayer insulating film and connects to the embedded conductor part 12 is formed. Finally, the GND contact 50 is formed by embedding a conductive material in the contact hole. In FIG. 3G, the interlayer insulating film is not shown, and only the GND contact 50 is illustrated.

(1.4) Variations

Solid-state image sensors 100A, 100B, 100C, 100D, 100E, 100F, and 100G, which are seven examples of the solid-state image sensor 100, will be described hereinafter with reference to FIGS. 4 to 9. The solid-state image sensors 100A to 100G differ from the solid-state image sensor 100 according to the first embodiment in that the sensors include embedded conductor parts 12A to 12G, respectively, instead of the embedded conductor part 12.

Note that the parts of the solid-state image sensors 100A to 100G that have similar functions as the solid-state image sensor 100 according to the first embodiment are neither described in detail nor illustrated in FIGS. 4 to 9. In other words, the FFTI 11, the insulating part 13, the well layer 21, the photoelectric conversion element 22, the gate insulating film 31, and the gate electrodes 32, 33, 34, and 35 formed in the pixels 9 of the solid-state image sensors 100A to 100G, as well as the floating diffusion 41 and the high-concentration impurity diffusion layer 42, will not be described in detail.

(1.4.1) First Variation

Figure 4:
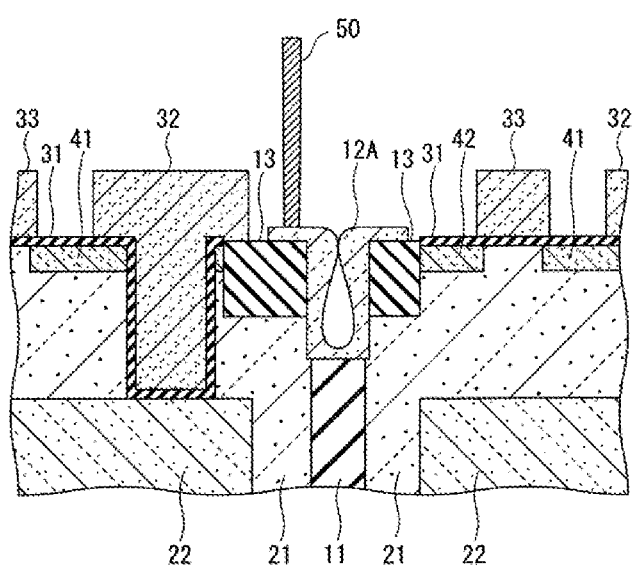
FIG. 4 is a cross-sectional view illustrating another example of the configuration of the solid-state image sensor according to the first embodiment of the present disclosure.

FIG. 4 is a cross-sectional view of the pixel 9 of the solid-state image sensor 100A, which is an example of a variation on the solid-state image sensor 100. Note that FIG. 4 is a cross-sectional view corresponding to FIG. 2B, described in the first embodiment.

As illustrated in FIG. 4, the embedded conductor part 12A of the solid-state image sensor 100A is a conductive film formed on the surface of a trench in an upper part of the substrate 2 having the FFTI 11 as the bottom surface. It is sufficient for the embedded conductor part 12A to have a part in close contact with the well layer 21. In other words, the embedded conductor part 12A may have a shape in which a part of the trench is embedded by a conductive material (the trench is not completely embedded by the conductive material).

Figure 9:
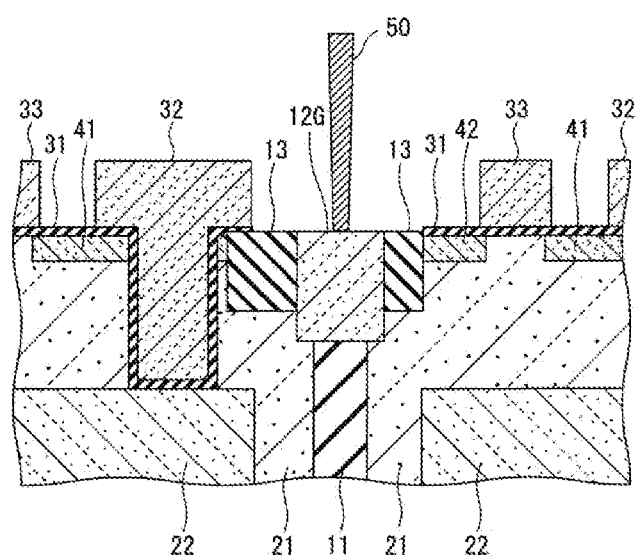
FIG. 9 is a cross-sectional view illustrating another example of the configuration of the solid-state image sensor according to the first embodiment of the present disclosure.

As illustrated in FIG. 9, the embedded conductor part 12B is a conductive film formed on the surface of the trench formed on the upper-side surface of the substrate 2, and in the trench, an air layer is present, surrounded on the sides and below by the conductive film. The embedded conductor part 12B may have a configuration in which pure polysilicon or an oxide film is embedded in the trench.

(1.4.2) Second Variation

Figure 5:
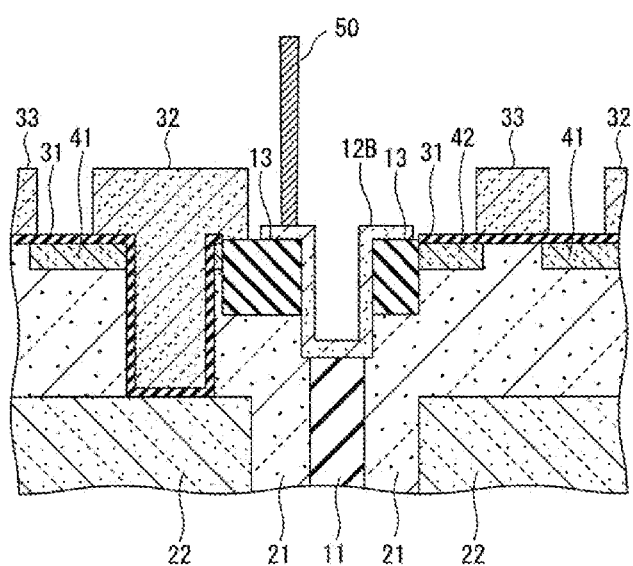
FIG. 5 is a cross-sectional view illustrating another example of the configuration of the solid-state image sensor according to the first embodiment of the present disclosure.

FIG. 5 is a cross-sectional view of the pixel 9 of the solid-state image sensor 100B, which is an example of a variation on the solid-state image sensor 100. Note that FIG. 5 is a cross-sectional view corresponding to FIG. 2B, described in the first embodiment.

As illustrated in FIG. 5, the embedded conductor part 12B of the solid-state image sensor 100B is a conductive film formed on the surface of a trench in an upper part of the substrate 2 having the FFTI 11 as the bottom surface. It is sufficient for the embedded conductor part 12B to have a part in close contact with the well layer 21. In other words, the embedded conductor part 12A may have a shape in which a part of the trench is embedded by a conductive material (the trench is not completely embedded by the conductive material). In other words, the embedded conductor parts 12A and 12B may have a shape in which the trench is not completely embedded by the conductive material.

As illustrated in FIG. 5, the embedded conductor part 12B is a conductive film formed on the surface of the trench formed on the upper-side surface of the substrate 2, and in the trench, an air layer is present, surrounded on the sides and below by the conductive film. The embedded conductor part 12B may have a configuration in which pure polysilicon or an oxide film is embedded in the trench.

(1.4.3) Third Variation

Figure 6A:
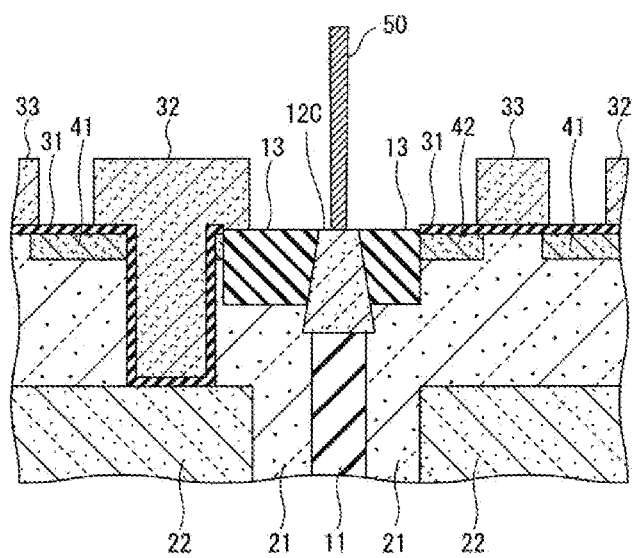
FIG. 6A is a cross-sectional view illustrating another example of the configuration of the solid-state image sensor according to the first embodiment of the present disclosure.
Figure 6B:
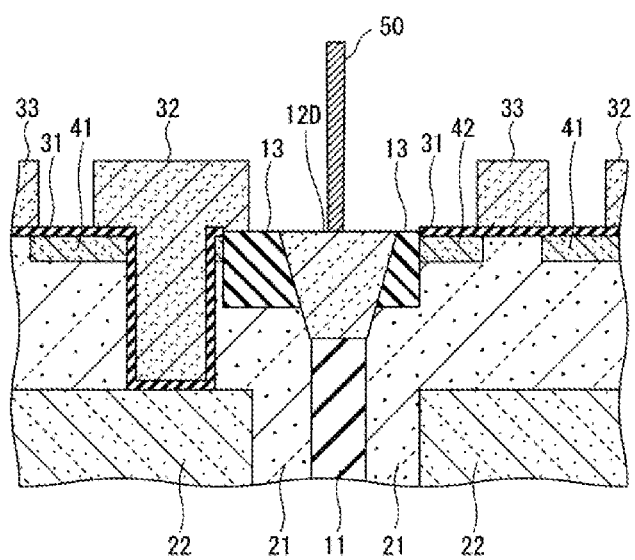
FIG. 6B is a cross-sectional view illustrating another example of the configuration of the solid-state image sensor according to the first embodiment of the present disclosure.

FIGS. 6A and 6B are cross-sectional views of the pixel 9 of the solid-state image sensor 100C, which is an example of a variation on the solid-state image sensor 100. Note that FIGS. 6A and 6B are cross-sectional views corresponding to FIG. 2B, described in the first embodiment.

As illustrated in FIGS. 6A and 6B, the embedded conductor parts 12C and 12D of the solid-state image sensor 100C are embedded in trenches formed in the vicinity of the top surface of the substrate 2, with the FFTI 11 serving as the bottom surface. The embedded conductor parts 12C and 12D have an inverted tapered shape or a tapered shape when viewed as a cross-section. Here, FIG. 6A illustrates, as an example, the configuration when the embedded conductor part 12C has a tapered shape in which the width decreases as the embedded conductor part 12C progresses from the bottom surface to the top surface. FIG. 6B illustrates, as an example, the configuration when the embedded conductor part 12D has a tapered shape in which the width decreases as the embedded conductor part 12C progresses from the top surface to the bottom surface.

To form the embedded conductor parts 12C and 12D, first, trenches for forming the FFTI 11 and the embedded conductor parts 12C and 12D are formed so as to penetrate the STI formed on the top surface of the substrate 2, and the FFTI 11 is formed by embedding an insulating film within the trenches. The embedded conductor parts 12C and 12D are then formed by embedding the upper part of the FFTI 11 within the trench with the conductive film. Depending on the processes such as etching when forming the embedded conductor parts 12C and 12D, the shape of the trench may be a tapered shape, and the cross-sectional shapes of the embedded conductor parts 12C and 12D may be tapered shapes as well.

(1.4.4) Fourth Variation

Figure 7:
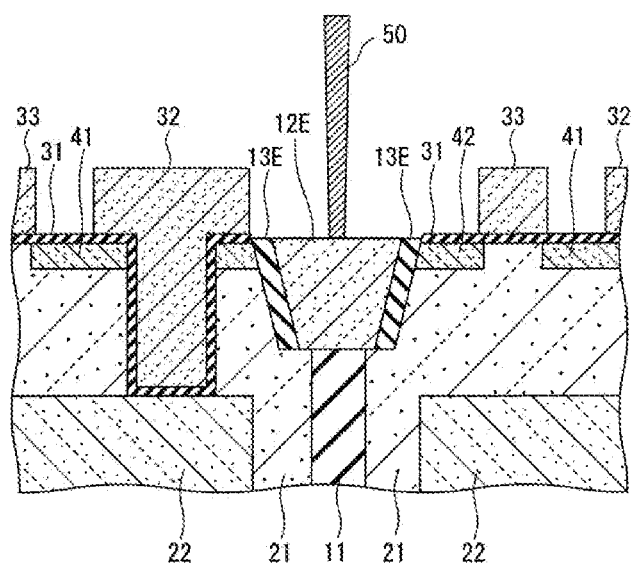
FIG. 7 is a cross-sectional view illustrating another example of the configuration of the solid-state image sensor according to the first embodiment of the present disclosure.

FIG. 7 is a cross-sectional view of the pixel 9 of the solid-state image sensor 100D, which is an example of a variation on the solid-state image sensor 100. Note that FIG. 7 is a cross-sectional view corresponding to FIG. 2B, described in the first embodiment.

As illustrated in FIG. 7, the embedded conductor part 12E and an insulating part 13E of the solid-state image sensor 100D each has a tapered shape in which the width decreases with progression from the bottom surface to the top surface, in a cross-sectional view.

To form the embedded conductor part 12E, first, for example, a trench is formed on the top surface of the substrate 2, and an STI to serve as the insulating part 13 is formed. Next, trenches for forming the FFTI 11 and the embedded conductor part 12E are formed so as to penetrate the STI, and the FFTI 11 is formed by embedding an insulating film within the trenches. Finally, the embedded conductor part 12E is formed by embedding the upper part of the FFTI 11 within the trench with the conductive film. Depending on the processes such as etching when forming the embedded conductor part 12E, the shape of the trench formed when forming the insulating part 13 and the shape of the trench formed when forming the embedded conductor part 12E may both be tapered shapes. In this case, the cross-sectional shapes of the insulating part 13 and the embedded conductor part 12E are similarly tapered shapes.

(1.4.5) Fifth Variation

Figure 8:
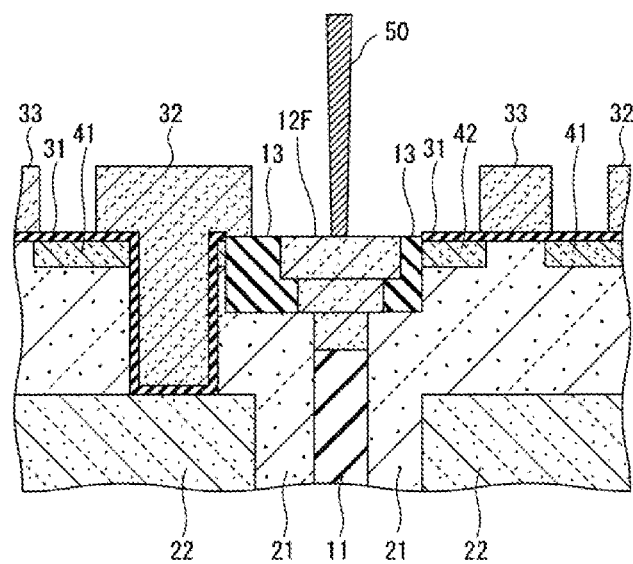
FIG. 8 is a cross-sectional view illustrating another example of the configuration of the solid-state image sensor according to the first embodiment of the present disclosure.

FIG. 8 is a cross-sectional view of the pixel 9 of the solid-state image sensor 100E, which is an example of a variation on the solid-state image sensor 100. Note that FIG.

8 is a cross-sectional view corresponding to FIG. 2B, described in the first embodiment.

As illustrated in FIG. 8, the embedded conductor part 12F of the solid-state image sensor 100E is embedded in a trench formed in the vicinity of the top surface of the substrate 2, with the FFTI 11 serving as the bottom surface. The embedded conductor part 12F has a shape in which a plurality of cylinders, having diameters that are increasingly large with progression toward the top surface of the substrate 2 in a cross-sectional view, are stacked.

To form the embedded conductor part 12F, first, trenches for forming the FFTI 11 and the embedded conductor part 12F are formed so as to penetrate the STI formed on the top surface of the substrate 2, and the FFTI 11 is formed by embedding an insulating film within the trenches. The embedded conductor part 12F is then formed by embedding the upper part of the FFTI 11 within the trench with the conductive film.

At this time, the shape of the trench may take on the shape of a plurality of cylinders which are stacked, as a result of the several instances of etching performed for the trenches for forming the FFTI 11 and the embedded conductor part 12F. In this case, the cross-sectional shape of the embedded conductor part 12F will also take on the shape of a plurality of cylinders which are stacked.

(1.4.6) Sixth Variation

FIG. 9 is a cross-sectional view of the pixel 9 of the solid-state image sensor 100F, which is an example of a variation on the solid-state image sensor 100. Note that FIG. 9 is a cross-sectional view corresponding to FIG. 2B, described in the first embodiment.

As illustrated in FIG. 9, the embedded conductor part 12G of the solid-state image sensor 100F is embedded in a trench formed in the vicinity of the top surface of the substrate 2, with the FFTI 11 serving as the bottom surface. The embedded conductor part 12G has a width wider than that of the FFTI 11 in a cross-sectional view.

Depending on the processes such as etching when forming the embedded conductor part 12G, the width of the part of the trench where the embedded conductor part 12G is formed may be wider than the width of the part of the trench where the FFTI 11 is formed. In this case, the embedded conductor part 12G will have a width wider than that of the FFTI 11 in a cross-sectional view.

Effects of First Embodiment

The solid-state imaging device 1, the solid-state image sensor 100, and the solid-state image sensors 100A to 100G according to the present embodiment provide the following effects.

(1) In the solid-state image sensor 100, the embedded conductor part 12, which functions as a contact electrode, is provided in close contact above the front full trench isolation (FFTI) 11 that isolates the pixels 9. Accordingly, there is no need to provide a contact electrode within the pixel 9 of the solid-state image sensor 100, and an increase in the surface area of each pixel 9 in plan view can be suppressed, which makes it possible to reduce the surface area of the solid-state image sensor 100.

(2) In the solid-state image sensor 100, the insulating part 13 is provided between the embedded conductor part 12 and the high-concentration impurity diffusion layer 42 in plan view. Accordingly, in the solid-state image sensor 100, the embedded conductor part 12 and the high-concentration impurity diffusion layer 42 are not in close contact with each other, and the distance between the embedded conductor part 12 and the high-concentration impurity diffusion layer 42 is greater. This makes it difficult for a strong electrical field to arise between the embedded conductor part 12 and the high-concentration impurity diffusion layer 42, and improves the stability of the output of the solid-state image sensor 100.

(3) In the solid-state image sensor 100, in a cross-sectional view, the insulating part 13 is provided between the embedded conductor part 12, which is formed deeper than the insulating part 13, and the high-concentration impurity diffusion layer 42, which is formed shallower than the insulating part 13 near the surface of the transistor formation surface of the substrate 2. As a result, the embedded conductor part 12 and the high-concentration impurity diffusion layer 42 are separated in the vertical direction (the depth direction of the substrate 2). Therefore, the occurrence of a strong electrical field between the embedded conductor part 12 and the high-concentration impurity diffusion layer 42 can be suppressed without increasing the size of the solid-state image sensor 100 in plan view, making it possible to both reduce the surface area of the solid-state image sensor 100 and improve the stability of the output.

2. Second Embodiment: Solid-State Image Sensor

A solid-state image sensor 200 according to a second embodiment of the present disclosure will be described. The solid-state image sensor 200 is a solid-state image sensor which can be used instead of the solid-state image sensor 100 of the solid-state imaging device 1 described in the first embodiment.

Figure 10:
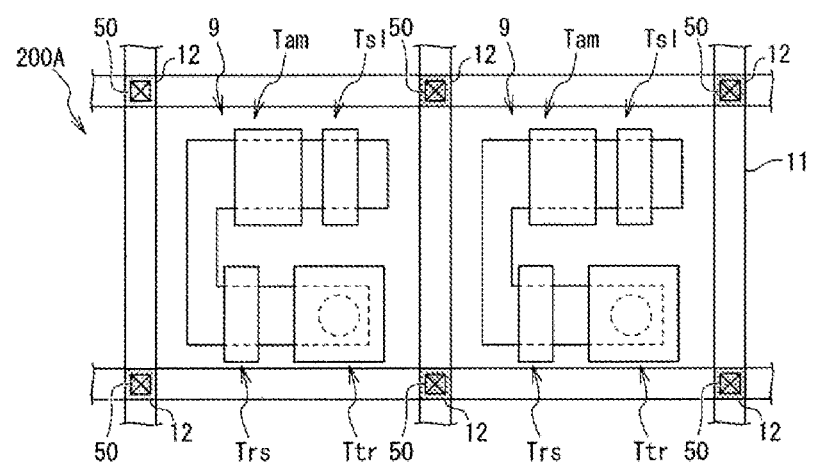
FIG. 10 is a plan view illustrating an example of the layout of a solid-state image sensor according to a second embodiment of the present disclosure.
Figure 11:
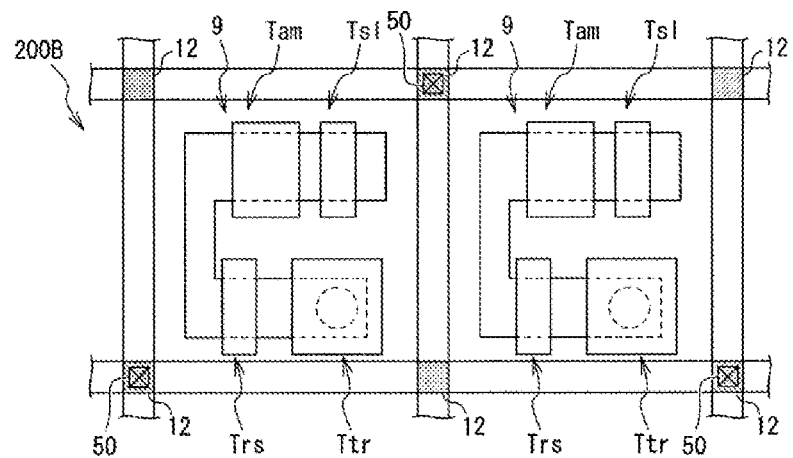
FIG. 11 is a plan view illustrating an example of the layout of the solid-state image sensor according to the second embodiment of the present disclosure.
Figure 12:
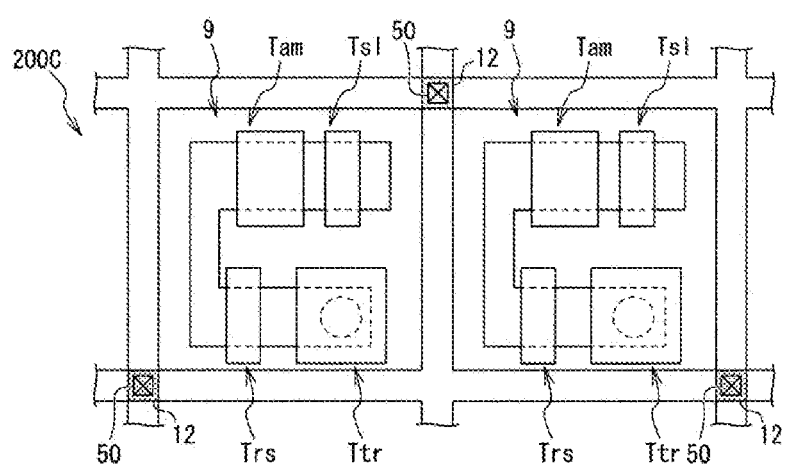
FIG. 12 is a plan view illustrating an example of the layout of the solid-state image sensor according to the second embodiment of the present disclosure.

The second embodiment will describe three examples of the solid-state image sensor 200, namely solid-state image sensors 200A, 200B, and 200C, with reference to FIGS. 10 to 12. Note that the parts of the solid-state image sensor 200 that have similar functions as the solid-state image sensor 100 according to the first embodiment are neither described in detail nor illustrated in FIGS. 10 to 12. In other words, the well layer 21, the photoelectric conversion element 22, the gate insulating film 31, and the gate electrodes 32, 33, 34, and 35 formed in the pixels 9 of the solid-state image sensor 200A, as well as the floating diffusion 41 and the high-concentration impurity diffusion layer 42, will not be described in detail.

(2.1) First Example of Solid-State Image Sensor 200

FIG. 10 is a plan view illustrating an example of the layout of the solid-state image sensor 200A, which is an example of the solid-state image sensor 200. As illustrated in FIG. 10, the solid-state image sensor 200A differs from the solid-state image sensor 100 according to the first embodiment in that the embedded conductor part 12 is provided in close contact with part of the surface of the FFTI 11 provided at the boundary between the pixels 9.

The arrangement of the FFTI 11 and the embedded conductor part 12, as well as the connection of the GND contact 50, will be described hereinafter.

As illustrated in FIG. 10, the FFTI 11 of the solid-state image sensor 200A is provided at all the boundaries between the pixels 9. Meanwhile, the embedded conductor part 12 of the solid-state image sensor 200A is provided only at a part of the boundary between the pixels 9, and in particular, of four pixels 9 arranged in a 2×2 arrangement, at a part where the four FFTIs 11 separate adjacent pixels 9 from each other (a center part of the four pixels 9). In other words, the embedded conductor part 12 of the solid-state image sensor 200A is provided at the four corners of a single pixel 9.

At the part where the four FFTIs 11 intersect, the embedded conductor part 12 is provided adjacent to the upper part of the FFTIs 11 (the front side in FIG. 10). The embedded conductor part 12 is formed deeper than the insulating part 13, and is accordingly disposed close to the well layer 21.

On the other hand, in the areas other than where the four FFTIs 11 intersect, the embedded conductor part 12 is not provided above the FFTIs 11 (the front side in FIG. 10), and the FFTIs 11 penetrate from the transistor formation side surface (the front side in FIG. 10) to the bottom surface (the back side in FIG. 10) of the substrate 2.

When the embedded conductor part 12 is provided above a part of the FFTI 11 (at the four corners of one pixel 9), the embedded conductor part 12 may be sealed by embedding a semiconductor material, removing the upper part of the embedded semiconductor material, and then covering the upper part with an insulator such as silicon oxide or the like, for example.

The embedded conductor part 12 is shared among the four adjacent pixels 9 as a contact electrode for GND contact. As such, the pixel 9 has four contact electrodes, one at each corner. Accordingly, in the solid-state image sensor 200A, even if one embedded conductor part 12 no longer functions as a contact electrode, another embedded conductor part 12 will function as a contact electrode, which improves the quality of the solid-state imaging device 1 that includes the solid-state image sensor 200A.

(2.2) Second Example of Solid-State Image Sensor 200

FIG. 11 is a plan view illustrating an example of the layout of the solid-state image sensor 200B, which is an example of the solid-state image sensor 200. As illustrated in FIG. 11, the solid-state image sensor 200B differs from the solid-state image sensor 100 according to the first embodiment in that the embedded conductor part 12 is provided in close contact with part of the surface of the FFTI 11 provided at the boundary between the pixels 9. The solid-state image sensor 200B differs from the solid-state image sensor 200A in that the GND contact 50 is connected to part of the embedded conductor part 12 which is formed, and only part of the embedded conductor part 12 functions as a contact electrode.

The arrangement of the FFTI 11 and the embedded conductor part 12, as well as the connection of the GND contact 50, will be described hereinafter.

As illustrated in FIG. 11, the FFTI 11 of the solid-state image sensor 200B is provided at all the boundaries between the pixels 9. Meanwhile, the embedded conductor part 12 of the solid-state image sensor 200B is provided only at a part of the boundary between the pixels 9, and in particular, of four pixels 9 arranged in a 2×2 arrangement, at a part where the four FFTIs 11 separate adjacent pixels 9 from each other (a center part of the four pixels 9). In other words, the embedded conductor part 12 of the solid-state image sensor 200B is provided at the four corners of a single pixel 9.

The embedded conductor part 12, which is formed deeper than the insulating part 13 and is formed to make contact with the well layer 21, is provided at the part where the four FFTIs 11 intersect, above the FFTIs 11 (the front side in FIG. 11). The GND contact 50 is connected to a part of the embedded conductor part 12 provided at the part where the four FFTIs 11 intersect. It is sufficient for the GND contact 50 to be capable of electrically connecting to the adjacent pixels 9. Accordingly, for example, as illustrated in FIG. 11, in one pixel 9, it is sufficient for the GND contact 50 to be connected to a pair of the embedded conductor parts 12 provided at opposing corners.

The embedded conductor part 12 disposed as described above is shared among the four adjacent pixels 9 as a contact electrode for GND contact. As such, the pixel 9 has two contact electrodes, one at each of two corners. Accordingly, in the solid-state image sensor 200B, even if one embedded conductor part 12 no longer functions as a contact electrode, another embedded conductor part 12 will function as a contact electrode, which improves the quality of the solid-state imaging device 1 that includes the solid-state image sensor 200B.

(2.3) Third Example of Solid-State Image Sensor 200

FIG. 12 is a plan view illustrating an example of the layout of the solid-state image sensor 200C, which is an example of the solid-state image sensor 200. As illustrated in FIG. 12, the solid-state image sensor 200C differs from the solid-state image sensor 100 according to the first embodiment in that the embedded conductor part 12 is provided in close contact with part of the surface of the FFTI 11 provided at the boundary between the pixels 9. The solid-state image sensor 200C also differs from the solid-state image sensor 200A in that the embedded conductor parts 12 are provided only at the positions of the opposing corners of a single pixel 9 (two corners).

The arrangement of the FFTI 11 and the embedded conductor part 12, as well as the connection of the GND contact 50, will be described hereinafter.

As illustrated in FIG. 12, the FFTI 11 of the solid-state image sensor 200C is provided at all the boundaries between the pixels 9. Additionally, the embedded conductor part 12 of the solid-state image sensor 200C is provided at a part of the boundary between the pixels 9. The embedded conductor part 12 is provided at each position on a pair of opposing corners of a single pixel 9.

The embedded conductor part 12, which is formed deeper than the insulating part 13 and is formed to make contact with the well layer 21, is provided each position of the opposing corners of a single pixel 9, above the FFTI 11 (the front side in FIG. 12). The GND contact 50 is connected to each embedded conductor part 12 provided at the opposing corners of the pixel 9.

The embedded conductor part 12 disposed as described above is shared among the four adjacent pixels 9 as a contact electrode for GND contact. As such, the pixel 9 has two contact electrodes, one at each of two corners. Accordingly, in the solid-state image sensor 200C, even if one embedded conductor part 12 no longer functions as a contact electrode, another embedded conductor part 12 will function as a contact electrode, which improves the quality of the solid-state imaging device 1 that includes the solid-state image sensor 200C.

Additionally, not providing the embedded conductor part 12 at a part where the GND contact 50 is not disposed, as in the solid-state image sensor 200C, improves the characteristics of the solid-state image sensor 200C, the yield when manufacturing the solid-state image sensor 200C, and the like.

Note that any of the embedded conductor parts 12A to 12G in the variations on the first embodiment may be used instead of the embedded conductor part 12 in the solid-state image sensor 200.

Effects of Second Embodiment

The solid-state image sensor 200 according to the present embodiment provides the following effects in addition to the effects described in the first embodiment.

(4) In the solid-state image sensor 200, the embedded conductor part 12, which functions as a contact electrode, is provided at a corner part of each pixel 9. As a result, the embedded conductor part 12 is shared among the four adjacent pixels 9 as a contact electrode for GND contact, and even if any one embedded conductor part 12 stops functioning as a contact electrode, another embedded conductor part 12 functions as a contact electrode. The quality of the solid-state imaging device 1 that includes the solid-state image sensor 200A can therefore be improved.

(5) In the solid-state image sensor 200, the embedded conductor part 12 is provided only at each opposing corner of each pixel 9 (two corners). Accordingly, the characteristics of the solid-state image sensor 200C, the yield when manufacturing the solid-state image sensor 200C, and the like can be improved compared to a situation where the embedded conductor part 12 is provided at each of the four corners of each pixel 9.

3. Third Embodiment: Solid-State Image Sensor

A solid-state image sensor 300 according to a third embodiment of the present disclosure will be described. The solid-state image sensor 300 is a solid-state image sensor which can be used instead of the solid-state image sensor 100 of the solid-state imaging device 1 described in the first embodiment.

(3.1) Configuration of Solid-State Image Sensor

In the third embodiment, the solid-state image sensor 300 will be described with reference to FIG. 13. Note that the parts of the solid-state image sensor 300 that have similar functions as the solid-state image sensor 100 according to the first embodiment are neither described in detail nor illustrated in FIG. 13. In other words, the well layer 21, the photoelectric conversion element 22, the gate insulating film 31, and the gate electrodes 32, 33, 34, and 35 formed in the pixels 9 of the solid-state image sensor 300, as well as the floating diffusion 41 and the high-concentration impurity diffusion layer 42, will neither be described in detail nor illustrated.

Figure 13:
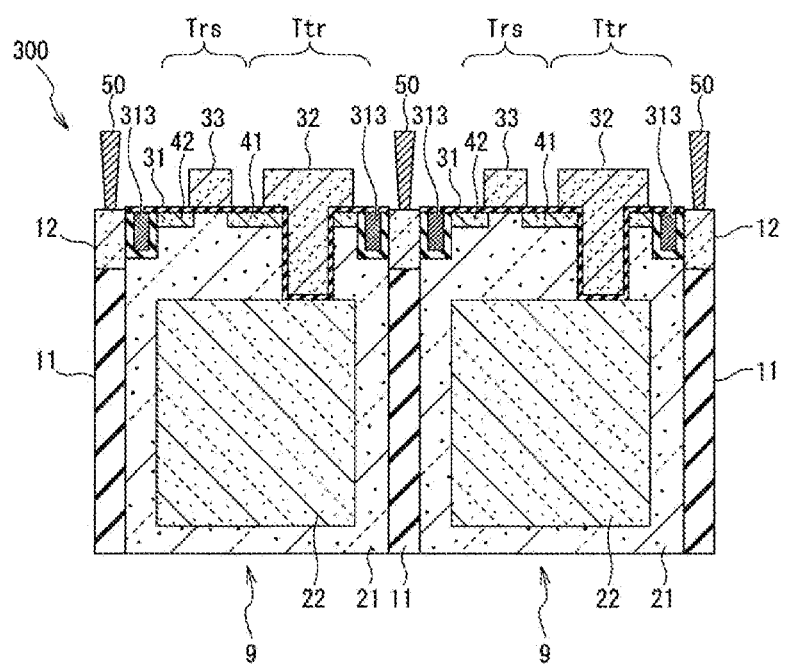
FIG. 13 is a cross-sectional view illustrating an example of the configuration of a solid-state image sensor according to a third embodiment of the present disclosure.

FIG. 13 is a cross-sectional view of the pixel 9 in the solid-state image sensor 300. Note that FIG. 13 is a cross-sectional view corresponding to FIG. 2B, described in the first embodiment. The solid-state image sensor 300 differs from the solid-state image sensor 100 according to the first embodiment in that an insulating part 313 is provided instead of the insulating part 13.

As illustrated in FIG. 13, the insulating part 313 has a two-layer structure constituted by an insulating film, which covers the surface of the trench provided between the embedded conductor part 12 and the high-concentration impurity diffusion layer 42, and pure polysilicon or an oxide embedded in the trench. The insulating part 313 may be provided with an air layer (an air gap) instead of the pure polysilicon or the oxide. In other words, it is sufficient for the insulating part 313 to be formed with an insulating material at least on the surface.

By providing such an insulating part 313, the width of the insulating part 313 can be reduced compared to the insulating part 13, which is useful in terms of reducing the size of the pixels.

Note that any of the embedded conductor parts 12A to 12G in the variations on the first embodiment may be used instead of the embedded conductor part 12 in the solid-state image sensor 300.

Effects of Third Embodiment

The solid-state image sensor 300 according to the present embodiment provides the following effects in addition to the effects described in the first embodiment. (6) In the solid-state image sensor 300, the insulating part 313 has a two-layer structure constituted by an insulating film formed on the surface of the trench, and pure polysilicon or an oxide film embedded in the trench on which the insulating film is formed, or an air layer. This makes it possible to form the insulating part 313 at a narrower width, which is even more effective in terms of reducing the surface area of the solid-state image sensor 300.

4. Fourth Embodiment: Solid-State Image Sensor

A solid-state image sensor 400 according to a fourth embodiment of the present disclosure will be described. The solid-state image sensor 400 is a solid-state image sensor which can be used instead of the solid-state image sensor 100 of the solid-state imaging device 1 described in the first embodiment.

(4.1) Configuration of Solid-State Image Sensor

In the fourth embodiment, the solid-state image sensor 400 will be described with reference to FIGS. 14A to 14C. The solid-state image sensor 400 differs from the solid-state image sensor 100 according to the first embodiment in that the sensors include an embedded conductor part 412 for interconnecting the pixels 9, instead of the embedded conductor part 12. The solid-state image sensor 400 also differs from the solid-state image sensor 100 according to the first embodiment in that an insulating part 414 is provided. The solid-state image sensor 400 furthermore differs from the solid-state image sensor 100 according to the first embodiment in that a contact electrode 460 and an embedded conductor part 43 are provided.

Figure 14A:
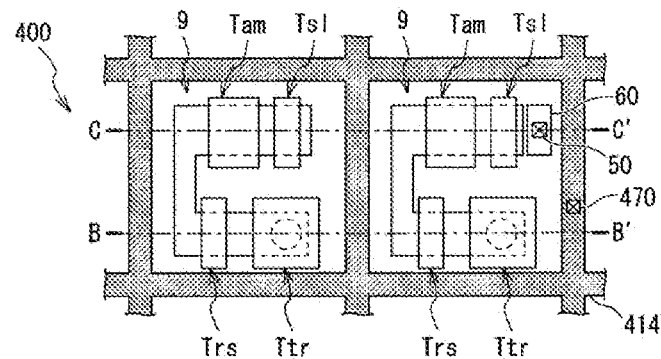
FIG. 14A is a plan view illustrating an example of the layout of a solid-state image sensor according to a fourth embodiment of the present disclosure.
Figure 14B:
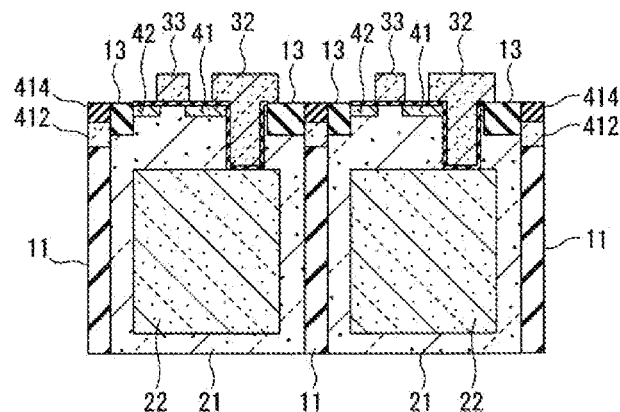
FIG. 14B is a cross-sectional view illustrating an example of the configuration of the solid-state image sensor according to the fourth embodiment of the present disclosure.
Figure 14C:
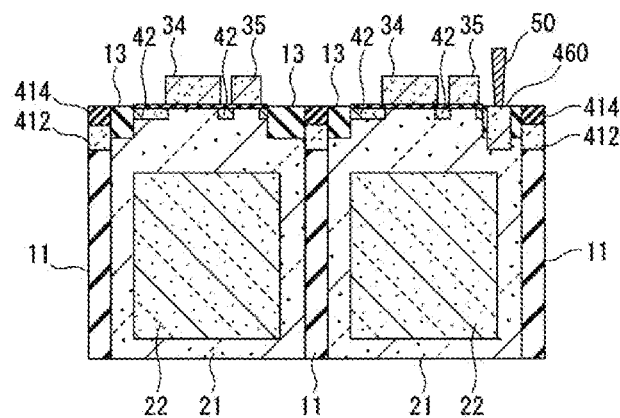
FIG. 14C is a cross-sectional view illustrating an example of the configuration of the solid-state image sensor according to the fourth embodiment of the present disclosure.

Note that the parts of the solid-state image sensor 400 that have similar functions as the solid-state image sensor 100 according to the first embodiment are neither described in detail nor illustrated in FIGS. 14A to 14C. In other words, the FFTI 11, the insulating part 13, the well layer 21, the photoelectric conversion element 22, the gate insulating film 31, and the gate electrodes 32, 33, 34, and 35 formed in the pixels 9 of the solid-state image sensor 400, as well as the floating diffusion 41 and the high-concentration impurity diffusion layer 42, will not be described in detail.

FIG. 14A is a plan view illustrating an example of the layout of the solid-state image sensor 400. FIG. 14B is a cross-sectional view of the pixel 9 in the solid-state image sensor 400, at a B-B' cross-section indicated in FIG. 14A. FIG. 14B is a cross-sectional view of a part including the transfer transistor Ttr and the reset transistor Trs. FIG. 14C is a cross-sectional view of the pixel 9 in the solid-state image sensor 400, at a C-C' cross-section indicated in FIG.

14A. FIG. 14C is a cross-sectional view of a part including the amplifying transistor Tam and the select transistor Tsl.

As illustrated in FIG. 14A, the solid-state image sensor 400 includes the contact electrode 460 within the pixel 9. Additionally, as illustrated in FIGS. 14B and 14C, the solid-state image sensor 400 includes the embedded conductor part 412, which is provided on an upper part of the FFTI 11, and the insulating part 414, which is provided on an upper part of the embedded conductor part 412.

The embedded conductor part 412 is provided between the FFTI 11 and the insulating part 414. The embedded conductor part 412 is formed at a position in the substrate 2 deeper than the insulating part 13, and is disposed in close contact with the well layers 21 of both of the adjacent pixels 9. In other words, the embedded conductor part 412 has a function for electrically connecting the pixels 9 to each other. On the other hand, unlike the embedded conductor part 12 of the first embodiment, the embedded conductor part 412 of the present embodiment does not function as a contact electrode.

The embedded conductor part 412 is formed from a similar material as the embedded conductor part 12. The embedded conductor part 412 is formed by embedding a conductive film in the upper part of the FFTI 11 and then removing the upper part of the embedded conductor.

The insulating part 414 is provided on an upper part of the embedded conductor part 412, and functions as a cap layer for the insulating part 414. The insulating part 414 is formed from, for example, silicon oxide or silicon nitride, or another insulating member. The insulating part 414 is formed by embedding an insulating member in an upper part of the embedded conductor part 412 within the trench.

As illustrated in FIG. 14A, the contact electrode 460 is a region that is connected to the GND contact 50 for making contact. As illustrated in FIG. 14C, the contact electrode 460 is connected to the well layer 21, and fixes the well layer 21 at a potential input from the GND contact 50. The contact electrode 460 is formed within the region of the pixel 9. The contact electrode 460 may be disposed within the region of the pixel 9 as well as outside the region of the pixel 9 (outside the pixel region 3 illustrated in FIG. 1). If the contact electrode 460 is formed within the region of the pixel 9, the contact electrode 460 is provided for one of several of the pixels 9. In this case, it is preferable that the pixel 9 for which the contact electrode 460 is provided be a pixel 9 provided with a blue (B) color filter. This is because in a pixel 9 where blue light, which has a short wavelength, is incident, the effect of differences in the pattern of the transistor formation surface, which is the surface opposite from the light incidence surface (the top surface in FIG. 14B), caused by the optical characteristics of blue light, can be suppressed. Accordingly, when the contact electrode 460 is provided for the pixel 9 having a blue (B) color filter, variation in outputs between the pixels 9 can be suppressed and the uniformity of output from each pixel 9 can be improved.

The pixel 9 is electrically connected by the embedded conductor part 412. Accordingly, one contact electrode 460 functions as a potential (reference potential) contact of the well layer 21 of the isolated individual pixels 9. In the pixel 9, the contact electrode 460 is a region, provided for making contact with the GND contact 50, in which impurities are diffused at a high concentration. As illustrated in FIG. 14C, the contact electrode 460 formed at a depth at which the bottom surface electrically contacts the well layer 21. The contact electrode 460 is formed by embedding a conductive film in a trench provided in the substrate 2. It is preferable to use silicon or another semiconductor material doped with P-type impurities, or a metal, for the conductive film, for example. For example, polycrystal silicon, amorphous silicon, epitaxially-grown silicon, or the like is preferable as the silicon.

Effects of Fourth Embodiment

The solid-state image sensor 400 according to the present embodiment provides the following effects.

(7) In the solid-state image sensor 400, the pixels 9 are electrically connected to each other by the embedded conductor part 412, and the contact electrode 460 is provided in one pixel 9 among several pixels 9. Through this, the number of contact electrodes 460 is reduced compared to a case where a contact electrode 460 is provided for each pixel 9, which is effective in reducing the surface area of the solid-state image sensor 300.

(8) In the solid-state image sensor 400, the contact electrode 460 may be provided in the pixel 9 where a blue (B) color filter is provided and blue light having a short wavelength is incident. In this case, variation in outputs between the pixels 9 due to the presence or absence of the contact electrode 460 can be suppressed, and the uniformity of output from each pixel 9 can be improved.

5. Fifth Embodiment: Solid-State Image Sensor

A solid-state image sensor 500 according to a fifth embodiment of the present disclosure will be described. The solid-state image sensor 500 is a solid-state image sensor which can be used instead of the solid-state image sensor 100 of the solid-state imaging device 1 described in the first embodiment.

(5.1) Configuration of Solid-State Image Sensor

In the fifth embodiment, the solid-state image sensor 500 will be described with reference to FIGS. 15A to 15C. As illustrated in FIG. 15A, the solid-state image sensor 500 differs from the solid-state image sensor 100 according to the first embodiment in that an embedded conductor part 512 is provided in close contact with part of the surface of the FFTI 11 provided at the boundary between the pixels 9. The solid-state image sensor 500 includes the embedded conductor part 512 at each of regions including the four corners of a single pixel 9 when viewed in plan view. The solid-state image sensor 500 also differs from the solid-state image sensor 100 according to the first embodiment in that an embedded conductor part 515 is provided at each boundary between two pixels 9.

Note that the parts of the solid-state image sensor 500 that have similar functions as the solid-state image sensor 100 according to the first embodiment are neither described in detail nor illustrated in FIGS. 15A to 15C. In other words, the FFTI 11, the insulating part 13, the well layer 21, the photoelectric conversion element 22, the gate insulating film 31, and the gate electrodes 32, 33, 34, and 35 formed in the pixels 9 of the solid-state image sensor 500, as well as the floating diffusion 41 and the high-concentration impurity diffusion layer 42, will not be described in detail.

FIG. 15A is a plan view illustrating an example of the layout of the solid-state image sensor 500. FIG. 15B is a cross-sectional view of the pixel 9 in the solid-state image sensor 500, at a D-D' cross-section indicated in FIG. 2A. FIG. 15B is a cross-sectional view of a region including the embedded conductor part 515, which has an electron trapping function. FIG. 15C is a cross-sectional view of the pixel 9 in the solid-state image sensor 500, at an E-E' cross-section indicated in FIG. 2A. FIG. 15C is a cross-sectional view of a region including the embedded conductor part 512, which functions as a contact electrode.

Similar to the embedded conductor part 12 in the first embodiment, the embedded conductor part 512 provided at each of the four corners of the pixels 9 functions as a contact electrode that fixes the potential of the well layer 21. As illustrated in FIG. 15A, the FFTI 11 of the solid-state image sensor 500 is provided at all the boundaries between the pixels 9. Meanwhile, the embedded conductor part 512 of the solid-state image sensor 500 is provided in a region including the boundary between the pixels 9, and in particular, of four pixels 9 arranged in a 2×2 arrangement, at a part where the four FFTIs 11 separate adjacent pixels 9 from each other (a center part of the four pixels 9). In other words, the embedded conductor part 512 of the solid-state image sensor 500 is provided at the four corners of a single pixel 9. As illustrated in FIG. 15B, the embedded conductor part 512 is provided above the FFTI 11 in the region including the four corners of the pixel 9 (the upper side in FIG. 15B), deeper than the insulating part 13 and in contact with the well layer 21. In FIG. 15A, the embedded conductor part 512 is illustrated has having a cross shape in plan view. The embedded conductor part 512 is formed from a similar material and process as the embedded conductor part 12 of the first embodiment.

The embedded conductor part 515 provided on the boundary between pixels 9 has an electron trapping function for suppressing charge overflow to adjacent pixels 9 through the embedded conductor part 512 or 515 during times of high light intensity. The embedded conductor part 515 is provided above a part of the FFTI 11 located at the boundary between pixels 9 (the upper side in FIG. 15B), deeper than the insulating part 13 and in contact with the well layer 21. It is preferable to use silicon or another semiconductor material doped with N-type impurities, or a metal, for the embedded conductor part 515, for example. For example, polycrystal silicon, amorphous silicon, epitaxially-grown silicon, or the like is preferable as the silicon.

The embedded conductor part 512 is electrically connected to the GND contact 50. As a result, the embedded conductor part 512 functions as a contact electrode. The embedded conductor part 512 is shared among the four adjacent pixels 9 as a contact electrode for GND contact. As such, the pixel 9 has four contact electrodes, one at each corner. Accordingly, in the solid-state image sensor 500, even if one embedded conductor part 512 no longer functions as a contact electrode, another embedded conductor part 512 will function as a contact electrode, which improves the quality of the solid-state imaging device 1 that includes the solid-state image sensor 500.

On the other hand, the embedded conductor part 515 is electrically connected to a VDD contact 570, which applies a positive voltage to the embedded conductor part 515. The embedded conductor part 515 is formed from an N-type semiconductor material, for example, and traps electrons accumulated in the photoelectric conversion element 22 when a positive voltage is applied. This prevents electrons from flowing to adjacent pixels 9 even when electrons stored in the photoelectric conversion element 22 are about to overflow to adjacent pixels due to high light intensity. Through this, the solid-state image sensor 500 can suppress color mixing between adjacent pixels 9 in which color filters of different colors are disposed.

In the solid-state image sensor 500, it is preferable to provide a difference in the strength between a barrier from the photoelectric conversion element 22 to the embedded conductor part 515, and a barrier from the photoelectric conversion element 22 to each transistor, such as the transfer transistor Ttr. This prevents electrons overflowing from the photoelectric conversion element 22 during times of high light intensity from affecting each transistor.

Note that any of the embedded conductor parts 12A to 12G in the variations on the first embodiment may be used instead of the embedded conductor part 512 in the solid-state image sensor 500. In the solid-state image sensor 500, the embedded conductor part 515 may have a similar configuration as the embedded conductor parts 12A to 12G of the variations on the first embodiment.

Furthermore, the solid-state image sensor 500 may have the insulating part 313 of the third embodiment instead of the insulating part 13.

Effects of Fifth Embodiment

The solid-state image sensor 500 according to the present embodiment provides the following effects in addition to the effects described in the first embodiment.

(9) The solid-state image sensor 500 includes the embedded conductor part 515 which is electrically connected to a VDD contact and which traps electrons that overflow from the photoelectric conversion element 22 when a positive voltage is applied from the VDD contact. Accordingly, situations where electrons overflow from the photoelectric conversion element 22 and flow to adjacent pixels 9 during times of high light intensity are suppressed, which suppresses color mixing with adjacent pixels 9.

6. Sixth Embodiment

A solid-state image sensor 600 according to a sixth embodiment of the present disclosure will be described. The solid-state image sensor 600 is a solid-state image sensor which can be used instead of the solid-state image sensor 100 of the solid-state imaging device 1 described in the first embodiment.

(6.1) Configuration of Solid-State Image Sensor

Figure 16:
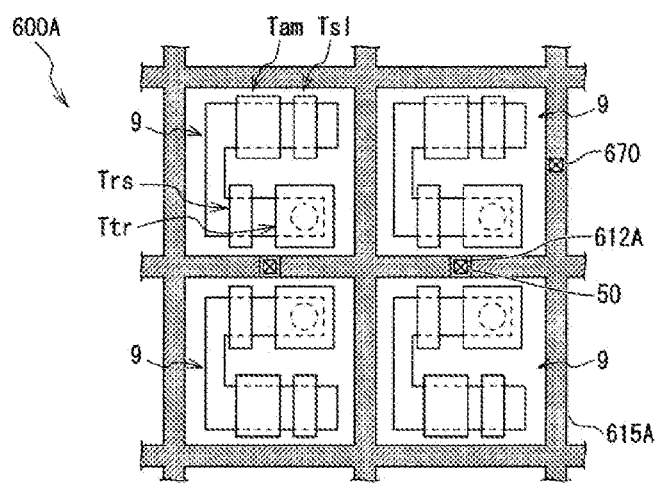
FIG. 16 is a plan view illustrating an example of the layout of a solid-state image sensor according to a sixth embodiment of the present disclosure.
Figure 17:
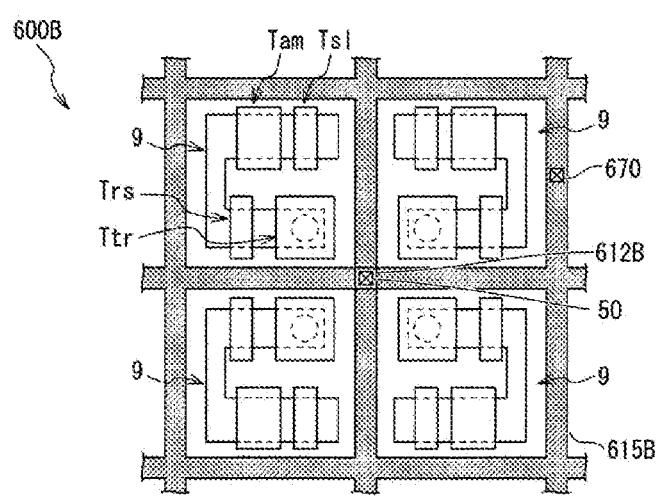
FIG. 17 is a plan view illustrating an example of the layout of the solid-state image sensor according to the sixth embodiment of the present disclosure.

The sixth embodiment will describe two examples of the solid-state image sensor 600, namely solid-state image sensors 600A and 600B, with reference to FIGS. 16 to 17. Note that the parts of the solid-state image sensor 600 that have similar functions as the solid-state image sensor 100 according to the first embodiment are neither described in detail nor illustrated in FIGS. 16 and 17. In other words, the FFTI 11, the insulating part 13, the well layer 21, the photoelectric conversion element 22, the gate insulating film 31, and the gate electrodes 32, 33, 34, and 35 formed in the pixels 9 of the solid-state image sensors 600A and 600B, as well as the floating diffusion 41 and the high-concentration impurity diffusion layer 42, will not be described in detail.

(6.1.1) First Example of Solid-State Image Sensor 600

FIG. 16 is a plan view illustrating an example of the layout of the solid-state image sensor 600A, which is an example of the solid-state image sensor 600. As illustrated in FIG. 16, the solid-state image sensor 600A differs from the solid-state image sensor 100 according to the first embodiment in that, instead of the embedded conductor part 12, an embedded conductor part 612A is provided in a part of a region on a boundary between two pixels 9. The solid-state image sensor 600A also differs from the solid-state image sensor 100 according to the first embodiment in that an embedded conductor part 615A is provided in a region excluding the region where the embedded conductor part 612A is formed on the FFTI 11 surrounding each pixel.

The arrangement of the FFTI 11, the embedded conductor part 612A, and the embedded conductor part 615A, as well as the connection of the GND contact 50, will be described hereinafter.

The solid-state image sensor 600A is a solid-state image sensor which takes two adjacent pixels 9 as a unit in which pixels are shared.

One embedded conductor part 612A is provided for each two adjacent pixels 9. The embedded conductor part 612A is provided at an upper part (the front side in FIG. 16) of the FFTI 11 (not shown), at the boundary between two adjacent pixels 9. The embedded conductor part 612A is provided near the center of the FFTI 11 interposed between the two pixels 9 in plan view. The top surface of the embedded conductor part 612A is exposed from the embedded conductor part 615A, which will be described later, and the GND contact 50 is connected thereto. The embedded conductor part 612A functions as a contact electrode, similar to the embedded conductor part 12 described in the first embodiment. The embedded conductor part 612A is formed in a similar way as the embedded conductor part 12, aside from being provided in a part on the FFTI 11 provided at the boundary between two adjacent pixels 9.

The embedded conductor part 615A is provided at an upper part of the FFTI 11 (not shown) provided at the boundary between the pixels 9. The embedded conductor part 615A is formed in a region excluding the region where the embedded conductor part 612A is formed on FFTI 11.

Similar to the embedded conductor part 515 described in the fifth embodiment, the embedded conductor part 615A has an electron trapping function for suppressing charge overflow to adjacent pixels 9 through the embedded conductor part 612A or 615A during times of high light intensity. The embedded conductor part 615A is formed in a similar way as the embedded conductor part 515, aside from being provided in a region surrounding most of each pixel 9.

A VDD contact 670, which applies a positive voltage to the embedded conductor part 615A, is connected to the embedded conductor part 615A. When a positive voltage is applied through the VDD contact 670, the embedded conductor part 615A traps electrons that overflow from the photoelectric conversion element 22. The VDD contact 670 is formed from a similar material and process the VDD contact 570 of the fifth embodiment.

In such a solid-state image sensor 600A, each unit in which pixels are shared, which is constituted by two pixels 9, shares an embedded conductor part 612A as a GND contact electrode. When a high-intensity light source is incident on the solid-state image sensor 600A and electrons overflow from the pixel 9 through the embedded conductor part 612A, although electrons flow into other pixels 9 within the shared pixel unit through the embedded conductor part 612A, the flow of electrons into other pixels 9 outside the shared pixel unit can be suppressed. A drop in image quality can therefore be suppressed by processing equivalent to pixel correction due to defects in the shared pixel unit.

(6.1.2) Second Example of Solid-State Image Sensor 600

FIG. 17 is a plan view illustrating an example of the layout of the solid-state image sensor 600B, which is an example of the solid-state image sensor 600. As illustrated in FIG. 17, the solid-state image sensor 600B differs from the solid-state image sensor 100 according to the first embodiment in that, instead of the embedded conductor part 12, an embedded conductor part 612B is provided in a region on a boundary surrounded by four pixels 9. The solid-state image sensor 600A also differs from the solid-state image sensor 100 according to the first embodiment in that an embedded conductor part 615B is provided in a region excluding the region where the embedded conductor part 612A is formed on the FFTI 11 surrounding each pixel.

The arrangement of the FFTI 11, the embedded conductor part 612B, and the embedded conductor part 615B, as well as the connection of the GND contact 50, will be described hereinafter.

The solid-state image sensor 600B is a solid-state image sensor which takes four pixels 9 arranged in a 2×2 matrix as a unit in which pixels are shared.

One embedded conductor part 612B is provided for the four pixels 9 arranged in a matrix. The embedded conductor part 612B is provided at an upper part (the front side in FIG. 17) of the FFTI 11 (not shown), at the center of the four pixels 9. The top surface of the embedded conductor part 612B is exposed from the embedded conductor part 615B, which will be described later, and the GND contact 50 is connected thereto.

The embedded conductor part 615B is provided at an upper part of the FFTI 11 (not shown) provided at the boundary between two adjacent pixels 9. The embedded conductor part 615B is formed in a region excluding the region where the embedded conductor part 612B is formed on FFTI 11.

Similar to the embedded conductor part 615A, the embedded conductor part 615B has an electron trapping function for suppressing electron overflow to adjacent pixels 9 through the embedded conductor part 612B or 615B during times of high light intensity. The embedded conductor part 615B is formed in a similar way as the embedded conductor part 515, aside from being provided in a region surrounding most of each pixel 9.

In such a solid-state image sensor 600B, each unit in which pixels are shared, which is constituted by two pixels 9, shares an embedded conductor part 612B as a GND contact electrode. When a high-intensity light source is incident on the solid-state image sensor 600B and electrons overflow from the pixel 9 through the embedded conductor part 612B, although electrons flow into other pixels 9 within the shared pixel unit through the embedded conductor part 612B, the flow of electrons into other pixels 9 outside the shared pixel unit can be suppressed. A drop in image quality can therefore be suppressed by processing equivalent to pixel correction due to defects in the shared pixel unit.

Effects of Sixth Embodiment

The solid-state image sensor 600 according to the present embodiment provides the following effects in addition to the effects described in the first embodiment. (10) The solid-state image sensor 600 includes the embedded conductor parts 615A and 615B which are electrically connected to a VDD contact and which trap electrons that overflow from the photoelectric conversion element 22 when a positive voltage is applied from the VDD contact. Accordingly, the solid-state image sensor 600 can suppress situations where electrons overflow from the photoelectric conversion element 22 and flow to adjacent pixels 9 during times of high light intensity, which suppresses color mixing with adjacent pixels 9.

(11) The solid-state image sensor 600 can suppress the inflow of electrons to other pixels 9 outside the shared pixel unit, even when electrons overflow from the pixel 9. Accordingly, the solid-state image sensor 600 can suppress a drop in image quality by processing equivalent to pixel correction due to defects in the shared pixel unit.

7. Seventh Embodiment

Next, an electronic device according to a seventh embodiment of the present disclosure will be described. FIG. 18 is a schematic diagram of an electronic device 1000 according to the seventh embodiment of the present disclosure.

The electronic device 1000 according to the seventh embodiment includes the solid-state imaging device 1, the optical lens 1002, a shutter device 1003, a driving circuit 1004, and the signal processing circuit 1005. In the electronic device 1000 according to the seventh embodiment, an embodiment in a case where the solid-state imaging device 1 according to the first embodiment of the present disclosure is used for an electronic device (for example, a camera) is illustrated as the solid-state imaging device 1.

The optical lens 1002 forms an image of image light (incident light 106) from a subject on an image capturing surface of the solid-state imaging device 1. As a result, signal charges are accumulated in the solid-state imaging device 1 over a set period. The shutter device 1003 controls a light irradiation period and a light blocking period for the solid-state imaging device 1. The driving circuit 1004 supplies a drive signal for controlling a transfer operation of the solid-state imaging device 1 and a shutter operation of the shutter device 1003. An operation of transferring a signal to the solid-state imaging device 1 is performed by the drive signal (timing signal) supplied from the driving circuit 1004. The signal processing circuit 1005 performs various signal processing on signals (pixel signals) output from the solid-state imaging device 1. An image signal having been subjected to signal processing is stored in a storage medium such as a memory or is output to a monitor.

Note that the electronic device 1000 to which the solid-state imaging device 1 can be applied is not limited to a camera, and the solid-state imaging device 1 can also be applied to other electronic devices. For example, the solid-state imaging device 1 may be applied to an imaging device such as a camera module for mobile equipment such as a mobile phone or a tablet terminal.

Further, in the seventh embodiment, a configuration in which the solid-state imaging device 1 according to the first embodiment is used in electronic device has been adopted as the solid-state imaging device 1, but other configurations may be employed. For example, the solid-state imaging device 1 according to the second embodiment, the solid-state imaging device 1 according to a variation, or the like may be used for the electronic device.

Note that the present technique can also take on the following configurations.

(1)

A solid-state image sensor, comprising:
a photoelectric conversion element that performs photoelectric conversion;
a front full trench isolation that penetrates from a first main surface to a second main surface of a substrate and that is formed between pixels including the photoelectric conversion element; and
a conductive part provided in close contact with a first main surface side of the front full trench isolation.

(2)

The solid-state image sensor according to the foregoing (1),
wherein the conductive part is embedded in a first trench formed in the first main surface of the substrate, and
the solid-state image sensor further comprises:
a high-concentration impurity diffusion layer formed on the first main surface of the substrate; and
an insulating part provided between the conductive part and the high-concentration impurity diffusion layer.

(3)

The solid-state image sensor according to the foregoing (2),
wherein the conductive part is formed deeper than the insulating part, and the high-concentration impurity diffusion layer is formed shallower than the insulating part.

(4)

The solid-state image sensor according to the foregoing (2) or (3), further including:
a well layer formed in a region deeper than the high-concentration impurity diffusion layer,
wherein the conductive part is disposed in close contact with the well layer in a region deeper than the insulating part.

(5)

The solid-state image sensor according to the foregoing (4), further including:
a cap layer provided in close contact with a first main surface side of the conductive part,
wherein the conductive part is disposed in close contact with the well layer of a plurality of pixels in close contact.

(6)

The solid-state image sensor according to any one of the foregoing (1) to (5),
wherein the front full trench isolation is provided surrounding the pixel in plan view, and
the conductive part is disposed in close contact with all or part of an upper surface of the front full trench isolation.

(7)

The solid-state image sensor according to the foregoing (6),
wherein the conductive part is provided in at least one of (a) above the front full trench isolation interposed between two adjacent pixels or (b) above the front full trench isolation located at a center of four pixels arranged in a 2×2 matrix.

(8)

The solid-state image sensor according to any one of the foregoing (1) to (6),
wherein the conductive part has a shape in which part or all of a second trench is embedded by a conductive material, the second trench taking the front full trench isolation as a bottom surface.

(9)

The solid-state image sensor according to the foregoing (2) or (3),
wherein the insulating part is formed having an insulating material at least on a surface of the insulating part.

(10)

The solid-state image sensor according to the foregoing (9),
wherein the insulating part has a two-layer structure constituted by an insulating film that covers a surface of a third trench provided between the conductive part and the high-concentration impurity diffusion layer, and pure polysilicon or an oxide embedded in the trench or an air layer.

(11)

The solid-state image sensor according to any one of the foregoing (1) to (10),
wherein the conductive part is a contact electrode shared between adjacent pixels.

(12)

An electronic device, further including:
a solid-state imaging device including a solid-state image sensor having a photoelectric conversion element that performs photoelectric conversion, a front full trench isolation that penetrates from a first main surface to a second main surface of a substrate and that is formed between pixels including the photoelectric conversion element, and a conductive part provided in close contact with a first main surface side of the front full trench isolation;
an optical lens that forms an image of image light from a subject on an image capturing surface of the solid-state imaging device; and
a signal processing circuit that performs signal processing on a signal output from the solid-state imaging device.

In the solid-state image sensor of the present disclosure, it is sufficient for the arrangements of the FFTI, the high-concentration impurity region provided in the vicinity thereof, the embedded conductors, and the insulating parts to have the above-described configurations, and the configurations of other parts are not limited. In other words, the semiconductor elements within the pixels may have any desired configurations aside from the configurations described above. Additionally, the conductivity types of the impurity diffusion regions of the solid-state image sensor according to the present disclosure are merely examples, and the P-type region and N-type region may be formed in the opposite manner.

The scope of the present invention is not limited to the exemplary embodiments illustrated in the drawings and described above, and includes all embodiments which have the object of the present invention and provide equivalent effects. Furthermore, the scope of the present invention is not limited to the combinations of features of the invention defined by the claims, and can be defined by all desired combinations of specific features among all the features disclosed.

REFERENCE SIGNS LIST

2 Substrate
9 Pixel
11 Front full trench isolation (FFTI)
12, 12A-12G, 412, 512, 515, 612A, 612B, 615A, 615B Embedded conductor part
13, 13E, 313, 414 Insulating part
21 Well layer
22 Photoelectric conversion element
23 Photoelectric conversion unit
31 Gate insulating film
32-35 Gate electrode
41 Floating diffusion
42 High-concentration impurity diffusion layer
43 Embedded conductor part
50 GND contact
60, 460 Contact electrode
100, 100A-100G, 200, 200A-200C, 300, 400, 500, 600, 600A, 600B Solid-state image sensor
570, 670 VDD contact
Tam Amplifying transistor
Trs Reset transistor
Tsl Select transistor
Ttr Transfer transistor

What is claimed is:

1. A solid-state image sensor, comprising:
a photoelectric conversion element that performs photoelectric conversion;
a front full trench isolation that penetrates from a first main surface to a second main surface of a substrate and that is formed between pixels including the photoelectric conversion element; and
a first conductor part provided in close contact with a first main surface side of the front full trench isolation,
wherein the first conductor part is embedded in a trench formed in the first main surface of the substrate, and
the solid-state image sensor further comprises:
a high-concentration impurity diffusion layer formed on the first main surface of the substrate; and
an insulating part provided between the first conductor part and the high-concentration impurity diffusion layer.

2. The solid-state image sensor according to claim 1,
wherein the first conductor part is formed deeper than the insulating part, and
the high-concentration impurity diffusion layer is formed shallower than the insulating part.

3. The solid-state image sensor according to claim 1, further comprising:
a well layer formed in a region deeper than the high-concentration impurity diffusion layer,
wherein the first conductor part is disposed in close contact with the well layer in a region deeper than the insulating part.

4. The solid-state image sensor according to claim 3, further comprising:
a cap layer provided in close contact with a first main surface side of the first conductor part,
wherein the first conductor part is disposed in close contact with the well layer of a plurality of adjacent pixels.

5. The solid-state image sensor according to claim 4, further comprising:
a contact electrode electrically connected to the well layer and formed within each of the pixels,
wherein via the first conductor part, the contact electrode is fixed to a potential input to the well layers of the plurality of adjacent pixels.

6. The solid-state image sensor according to claim 1,
wherein the front full trench isolation is provided surrounding the pixel in plan view, and
the first conductor part is disposed in close contact with all or part of an upper surface of the front full trench isolation.

7. The solid-state image sensor according to claim 6, wherein the first conductor part is provided in at least one of (a) above the front full trench isolation interposed between two adjacent pixels or (b) above the front full trench isolation located at a center of four pixels arranged in a 2×2 matrix.

8. The solid-state image sensor according to claim 1, wherein the first conductor part has a shape in which part or all of the trench is embedded by a conductive material, the trench taking the front full trench isolation as a bottom surface.

9. The solid-state image sensor according to claim 1, wherein the insulating part is formed having an insulating material at least on a surface of the insulating part.

10. The solid-state image sensor according to claim 9, wherein the insulating part has a two-layer structure constituted by an insulating film that covers a surface of a trench provided between the first conductor part and the high-concentration impurity diffusion layer, and pure polysilicon or an oxide embedded in the trench or an air layer.

11. The solid-state image sensor according to claim 1, wherein the first conductor part is a contact electrode shared between adjacent pixels.

12. A solid-state image sensor, comprising:
a photoelectric conversion element that performs photoelectric conversion;
a front full trench isolation that penetrates from a first main surface to a second main surface of a substrate and that is formed between pixels including the photoelectric conversion element;
a first conductor part provided in close contact with a first main surface side of the front full trench isolation; and
a second conductor part disposed in close contact with all or part of an upper surface of the front full trench isolation and provided deeper than an insulating part and in contact with a well layer, the second conductor part attracting and trapping electrons accumulated in the photoelectric conversion element when a positive voltage is applied to the second conductor part.

13. An electronic device, comprising:
a solid-state imaging device including a solid-state image sensor having a photoelectric conversion element that performs photoelectric conversion, a front full trench isolation that penetrates from a first main surface to a second main surface of a substrate and that is formed between pixels including the photoelectric conversion element, and a first conductor part provided in close contact with a first main surface side of the front full trench isolation;
an optical lens that forms an image of image light from a subject on an image capturing surface of the solid-state imaging device; and
a signal processing circuit that performs signal processing on a signal output from the solid-state imaging device,
wherein the first conductor part is embedded in a trench formed in the first main surface of the substrate, and
the solid-state image sensor further comprises:
a high-concentration impurity diffusion layer formed on the first main surface of the substrate; and
an insulating part provided between the first conductor part and the high-concentration impurity diffusion layer.

* * * * *